(12) United States Patent
Kawasaki

(10) Patent No.: US 9,479,124 B2
(45) Date of Patent: Oct. 25, 2016

(54) DISTORTION COMPENSATION DEVICE AND DISTORTION COMPENSATION METHOD

(71) Applicant: FUJITSU LIMITED, Kawasaki-shi, Kanagawa (JP)

(72) Inventor: Toshio Kawasaki, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 14/938,059

(22) Filed: Nov. 11, 2015

(65) Prior Publication Data

US 2016/0204750 A1 Jul. 14, 2016

(30) Foreign Application Priority Data

Jan. 8, 2015 (JP) ................. 2015-002670

(51) Int. Cl.
*H03F 1/26* (2006.01)
*H03F 1/32* (2006.01)
*H03F 3/21* (2006.01)

(52) U.S. Cl.
CPC ............ *H03F 1/3252* (2013.01); *H03F 3/211* (2013.01); *H03F 2201/3233* (2013.01); *H03F 2203/21106* (2013.01)

(58) Field of Classification Search
CPC ........................................................ H03F 1/26
USPC .................... 330/149, 124 R; 375/296, 297; 455/114.3
See application file for complete search history.

(56) References Cited

U.S. PATENT DOCUMENTS 5,867,065 A * 2/1999 Leyendecker ........ H03F 1/3247
330/149

| 6,054,896 | A | * | 4/2000 | Wright | H03F 1/0294 |
|---|---|---|---|---|---|
| | | | | | 330/149 |
| 6,147,553 | A | | 11/2000 | Kolanek | |
| 6,674,324 | B1 | * | 1/2004 | Ocenasek | H03F 1/3235 |
| | | | | | 330/149 |
| 9,088,250 | B2 | | 7/2015 | Kawasaki | |
| 9,197,465 | B2 | * | 11/2015 | Ma | H04L 25/4902 |

(Continued)

FOREIGN PATENT DOCUMENTS

EP 2642660 A2 9/2013
EP 2405277 5/2014

(Continued)

OTHER PUBLICATIONS

EESR—The Extended European Search Report of European Patent Application No. 15194834.6 mailed May 27, 2016.

*Primary Examiner* — Patricia T Nguyen
(74) *Attorney, Agent, or Firm* — Fujitsu Patent Center

(57) ABSTRACT

A distortion compensation device for correcting balance between a first branch and a second branch, includes: an adjustment unit that is arranged in an input stage of a first nonlinear amplifier on the first branch and outputs a signal obtained by adjusting a phase and an amplitude of a first branch signal by using a balance correction amount to the first nonlinear amplifier; a first calculation unit that calculates a first inverse distortion characteristic of an entire outphasing amplifier based on an input signal and a combined signal; a second calculation unit that calculates a replica signal of the first branch signal based on the calculated first inverse distortion characteristic, a second branch signal, and the combined signal; and a third calculation unit that calculates the balance correction amount based on the calculated replica signal of the first branch signal and the signal output from the adjustment unit.

3 Claims, 26 Drawing Sheets

(56) References Cited

U.S. PATENT DOCUMENTS

| | | | |
|---|---|---|---|
| 2004/0263246 A1* | 12/2004 | Robinson | H03F 1/0244 330/124 R |
| 2005/0258898 A1* | 11/2005 | Hongo | H03F 1/3241 330/149 |
| 2009/0067541 A1 | 3/2009 | Byun et al. | |
| 2010/0321107 A1 | 12/2010 | Honcharenko | |
| 2012/0224653 A1 | 9/2012 | Lozhkin | |
| 2013/0335140 A1 | 12/2013 | Kawasaki | |
| 2014/0002186 A1* | 1/2014 | Kawasaki | H03F 1/3252 330/124 R |
| 2015/0295545 A1* | 10/2015 | Onishi | H04B 1/0475 455/114.3 |

FOREIGN PATENT DOCUMENTS

| | | |
|---|---|---|
| JP | 2002-506309 | 2/2002 |
| JP | 2009-534988 | 9/2009 |
| JP | 2014-003490 | 1/2014 |
| JP | 2014-011653 | 1/2014 |
| JP | 5432374 | 3/2014 |
| WO | 99/45642 | 9/1999 |
| WO | 2007/133323 | 11/2007 |
| WO | 2010/147754 | 12/2010 |

* cited by examiner

DISTORTION COMPENSATION DEVICE AND DISTORTION COMPENSATION METHOD

CROSS-REFERENCE TO RELATED APPLICATION

This application is based upon and claims the benefit of priority of the prior Japanese Patent Application No. 2015-002670, filed on Jan. 8, 2015, the entire contents of which are incorporated herein by reference.

FIELD

The embodiments discussed herein are related to a distortion compensation device and a distortion compensation method.

BACKGROUND

Amplifiers have been used in various electronic apparatuses. Amplifiers are commonly known to have a highest efficiency in an output saturation region (i.e., in a nonlinear state).

An amplification apparatus of outphasing type (hereinafter, sometimes referred to as an "outphasing amplifier") has been proposed as an amplification apparatus that operates its amplifiers in an output saturation region. In other words, an outphasing amplifier is a LINC (Linear Amplification with Nonlinear Components) linear amplifier using nonlinear amplifiers (i.e., saturated amplifiers).

FIG. 1 is a block diagram illustrating an example of a related outphasing amplifier. As illustrated in FIG. 1, the outphasing amplifier includes a signal component separator (SCS), a first nonlinear amplifier (amplifier A) of a "first branch," and a second nonlinear amplifier (amplifier B) of a "second branch."

The signal component separator separates an input modulation signal Sin(t) including envelope variations, input to an input terminal into a phase modulation signal pair $Sc1(t)$ and $Sc2(t)$ having a phase difference according to the amplitude of the input modulation signal Sin(t), and outputs the phase modulation signal pair $Sc1(t)$ and $Sc2(t)$. Hereinafter, $Sc1(t)$ may be referred to as a "first branch signal," and $Sc2(t)$ as a "second branch signal."

For example, the input modulation signal Sin(t) is a modulation signal with amplitude modulation and phase modulation (angular modulation). The phase modulation signal pair $Sc1(t)$ and $Sc2(t)$ includes constant amplitude phase modulation signals having a constant envelope. Both the input modulation signal Sin(t) and the phase modulation signal pair $Sc1(t)$ and $Sc2(t)$ may be baseband signals or IF signals. The signal component separator generates the phase modulation signal pair $Sc1(t)$ and $Sc2(t)$ as digital signals.

$Sc1(t)$, one of the phase modulation signal pair generated by the signal component separator, is converted from a digital signal into an analog signal by a D/A converter. $Sc1(t)$ is further passed through a filter, so that components corresponding to the frequency band of $Sc1(t)$ are extracted and the other frequency components are suppressed. Similarly, $Sc2(t)$, the other of the phase modulation signal pair, is converted from a digital signal into an analog signal by a D/A converter. $Sc2(t)$ is further passed through a filter so that components corresponding to the frequency band of $Sc2(t)$ are extracted and the other frequency components are suppressed.

An orthogonal modulator orthogonally modulates $Sc1(t)$ passed through the filter by using a high frequency signal (oscillation signal) SL(t) (not illustrated) output from an oscillator, thereby generating and outputting $S1(t)$ which is an RF signal. Similarly, an orthogonal modulator orthogonally modulates $Sc2(t)$ passed through the filter by using the high frequency signal SL(t) output from the oscillator, thereby generating and outputting $S2(t)$ which is an RF signal.

The input modulation signal Sin(t) will be expressed by the following equation (1). Then, the phase modulation signal pair $Sc1(t)$ and $Sc2(t)$ and the high frequency signal pair $S1(t)$ and $S2(t)$ can be expressed by the following equations (2) to (6):

$$\text{Sin}(t) = a(t) \cdot \cos[\theta(t)] \quad (1)$$

$$Sc1(t) = a_{max} \cdot \cos[\theta(t) + \psi(t)] \quad (2)$$

$$Sc2(t) = a_{max} \cdot \cos[\theta(t) - \psi(t)] \quad (3)$$

$$S1(t) = a_{max} \cdot \cos[2\pi \cdot fc \cdot t + \theta(t) + \psi(t)] \quad (4)$$

$$S2(t) = a_{max} \cdot \cos[2\pi \cdot fc \cdot t + \theta(t) - \psi(t)] \quad (5)$$

$$\psi(t) = \cos^{-1}[a(t)/(2 \cdot a_{max})] \quad (6)$$

In equations (1) to (6), a(t) is the amplitude modulation component of the input modulation signal Sin(t). θ(t) is the phase modulation component (angular modulation component) of the input modulation signal Sin(t). fc is the frequency of the high frequency component SL(t) output from the oscillator, i.e., the carrier frequency of the high frequency signal pair $S1(t)$ and $S2(t)$. $a_{max}$ is a constant that is set based on a saturation output level of the amplifier pair (i.e., the foregoing first and second nonlinear amplifiers). Such a configuration including the signal component separator, the oscillator, and the orthogonal modulators is used to generate the high frequency signal pair $S1(t)$ and $S2(t)$ that are modulated in phase to produce a phase difference of 2×ψ(t) according to the amplitude of the input modulation signal Sin(t).

As described above, the amplifier pair includes the first nonlinear amplifier and the second nonlinear amplifier which are arranged in parallel with each other. The first nonlinear amplifier and the second nonlinear amplifier have generally the same gain and phase characteristics. The first nonlinear amplifier amplifies $S1(t)$, one of the high frequency signal pair, output from the orthogonal amplifier. The second nonlinear amplifier amplifies $S2(t)$, the other of the high frequency signal pair, output from the orthogonal amplifier.

A combiner combines a high frequency signal pair $G \times S1(t)$ and $G \times S2(t)$ amplified by the amplifier pair (G is the gain of the amplifiers) and outputs the combined signal as an output high frequency signal Sout(t) from an output terminal. Assuming that the pass phase of the high frequency signal pair $S1(t)$ and $S2(t)$ is (1), the output high frequency signal Sout(t) can be expressed by the following equation (7):

$$\begin{aligned} \text{Sout}(t) &= G \cdot a_{max} \cdot \cos[2\pi \cdot fc \cdot t + \theta(t) + \psi(t) + \phi] + \\ &\quad G \cdot a_{max} \cdot \cos[2\pi \cdot fc \cdot t + \theta(t) - \psi(t) + \phi] = \\ &\quad 2 \cdot G \cdot a_{max} \cdot \cos[2\pi \cdot fc \cdot t + \theta(t) + \phi] \cdot \cos[\psi(t)] = \\ &\quad G \cdot a(t) \cdot \cos[2\pi \cdot fc \cdot t + \theta(t) + \phi] \end{aligned} \quad (7)$$

As expressed in equation (7), the outphasing amplifier provides the output high frequency signal Sout(t) obtained by amplifying the input modulation signal Sin(t) by the gain G, with highly efficient linear amplification.

Meanwhile, the outphasing amplifier causes distortion due to characteristic variations and the like of the two nonlinear amplifiers. To suppress such a nonlinear distortion and reduce an adjacent channel leakage ratio (ACLR), some wireless transmission apparatuses equipped with an outphasing amplifier may include a distortion compensation device for compensating the nonlinear distortion.

For example, some wireless transmission apparatuses including a related outphasing amplifier may include a distortion compensation device that calculates distortion characteristics due to a characteristic difference between the two nonlinear amplifiers (hereinafter, may be referred to as "branch distortion characteristics") and a distortion characteristic of the entire outphasing amplifier (hereinafter, may referred to as "overall distortion characteristic") and further calculates inverse characteristics of the respective distortion characteristics (i.e., "inverse branch characteristics" and "inverse overall characteristic"). The distortion compensation device then multiplies a transmission baseband signal by the inverse overall characteristic in an input stage of the outphasing amplifier. The signal component separator of the outphasing amplifier decomposes the input signal into the two branch signals having a phase difference according to the amplitude of the input signal. The distortion compensation device multiplies the branch signals by the respective inverse branch characteristics. In such a manner, the overall distortion characteristic of the outphasing amplifier and the balance between the branches can be compensated. In other words, the nonlinear distortion of the outphasing amplifier can be compensated.

[Patent Document 1] Japanese Laid-open Patent Publication No. 2014-011653

However, to compensate the overall distortion characteristic of the outphasing amplifier and the balance between the branches, the foregoing related distortion compensation device calculates the overall distortion characteristic and the branch distortion characteristics before calculating the inverse characteristics thereof as described above. This entails a high calculation load.

SUMMARY

According to an aspect of the embodiments, a distortion compensation device for correcting balance between a first branch and a second branch of an outphasing amplifier, the outphasing amplifier including a first nonlinear amplifier that is arranged on the first branch, a second nonlinear amplifier that is arranged on the second branch, a signal component separation unit that separates an input signal into a first branch signal and a second branch signal having a constant amplitude, the first branch signal and the second branch signal having a phase difference according to an amplitude of the input signal, and outputs the first branch signal and the second branch signal to the first branch and the second branch, respectively, and a combiner that combines a first amplification signal output from the first nonlinear amplifier and a second amplification signal output from the second nonlinear amplifier and outputs the combined signal, the distortion compensation device includes: an adjustment unit that is arranged in an input stage of the first nonlinear amplifier on the first branch and outputs a signal obtained by adjusting a phase and an amplitude of the first branch signal by using a balance correction amount to the first nonlinear amplifier; a first calculation unit that calculates a first inverse distortion characteristic of the entire outphasing amplifier based on the input signal and the combined signal; a second calculation unit that calculates a replica signal of the first branch signal based on the calculated first inverse distortion characteristic, the second branch signal, and the combined signal; and a third calculation unit that calculates the balance correction amount based on the calculated replica signal of the first branch signal and the signal output from the adjustment unit.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
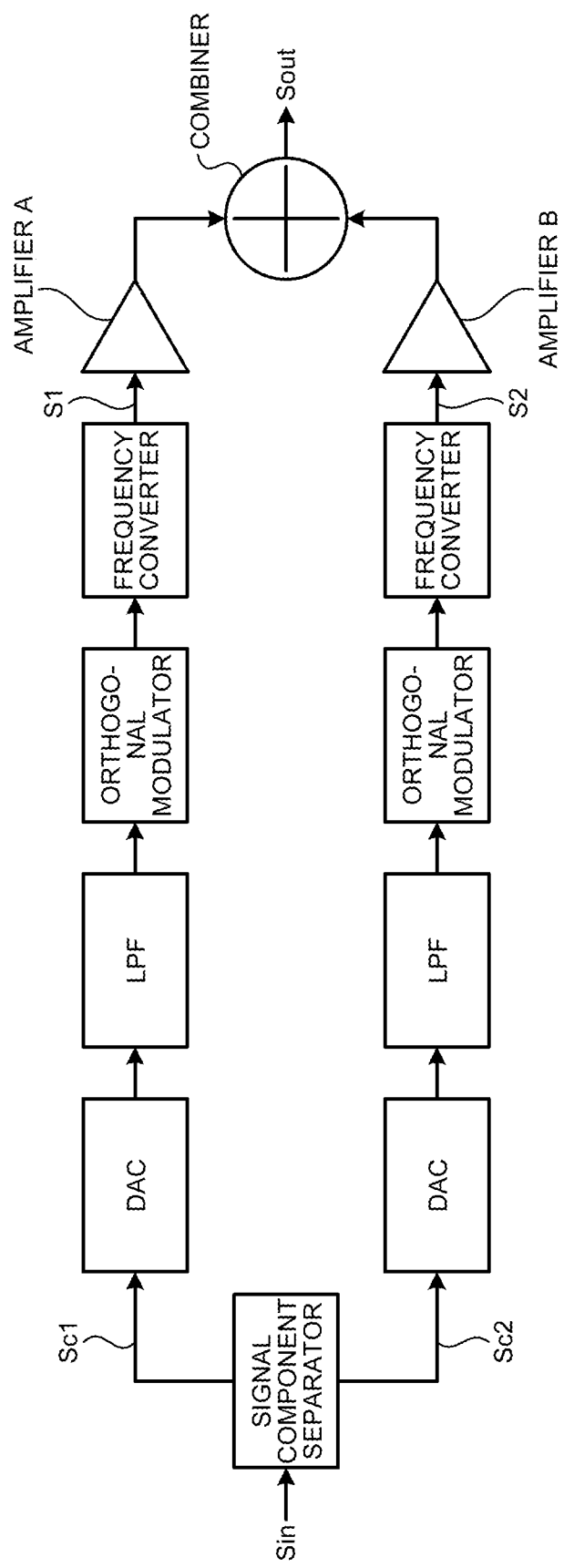
FIG. 1 is a block diagram illustrating an example of a related outphasing amplifier.

Preferred embodiments will be explained with reference to accompanying drawings. It should be noted that the distortion compensation device and the distortion compensation method disclosed in the present application are not limited to the embodiments. In the embodiments, components having similar functions are designated by the same reference numerals. A redundant description will be omitted.

[a] First Embodiment

Configuration Example of Wireless Transmission Apparatus

Figure 2:
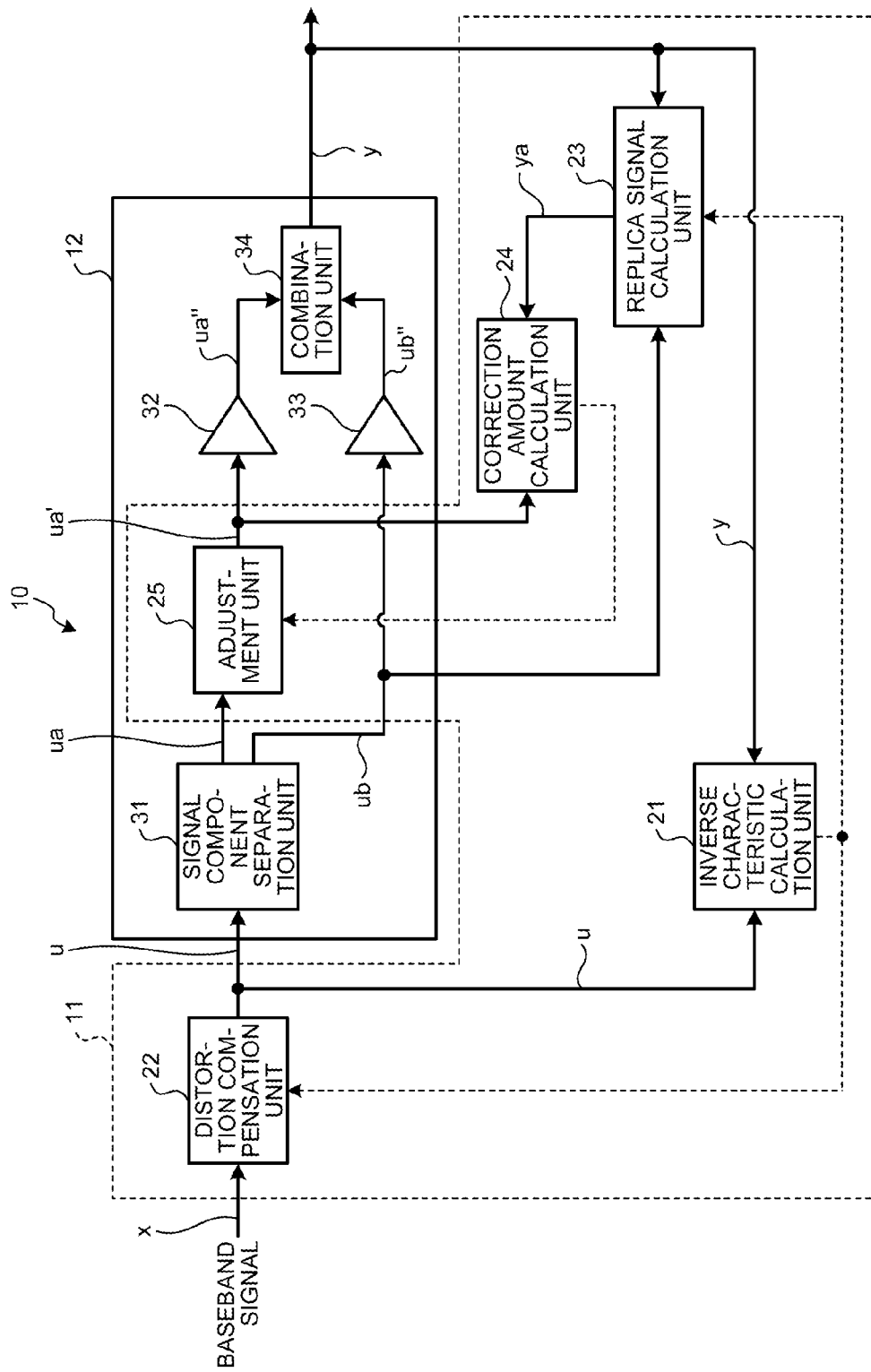
FIG. 2 is a block diagram illustrating an example of a wireless transmission apparatus including a distortion compensation device according to a first embodiment.

FIG. 2 is a block diagram illustrating an example of a wireless transmission apparatus including a distortion compensation device according to a first embodiment. An antenna is omitted in FIG. 2. In FIG. 2, a wireless transmission apparatus 10 includes a distortion compensation device 11 and an outphasing amplifier 12. As illustrated in FIG. 2, the distortion compensation device 11 includes an inverse characteristic calculation unit 21, a distortion compensation unit 22, a replica signal calculation unit 23, a correction amount calculation unit 24, and an adjustment unit 25. The outphasing amplifier 12 has, for example, the same configuration as that of the outphasing amplifier illustrated in FIG. 1. For ease of description, the DACs, the LPFs, the orthogonal modulators, and the frequency conversion units are omitted in FIG. 2. In FIG. 2, the outphasing amplifier 12 includes a signal component separation unit 31, nonlinear amplifiers 32 and 33, and a combination unit 34. The signal component separation unit 31 corresponds to the signal component separator illustrated in FIG. 1. The nonlinear amplifiers 32 and 33 correspond to the first nonlinear amplifier and the second nonlinear amplifier illustrated in FIG. 1, respectively. The combination unit 34 corresponds to the combiner illustrated in FIG. 1. For example, the combination unit 34 is a Chireix combiner.

In the distortion compensation device 11, the inverse characteristic calculation unit 21 calculates an inverse characteristic of the distortion characteristic of the entire outphasing amplifier 12 (hereinafter, may be referred to as a "first inverse distortion characteristic") based on a predistortion signal series (PD signal series) u output from the distortion compensation unit 22 and an output signal of the outphasing amplifier 12, namely, a combined signal series y which is an output signal of the combination unit 34. The "first inverse distortion characteristic" corresponds to the foregoing "overall inverse characteristic." Although omitted in FIG. 2, the combined signal series y which is the output signal of the outphasing amplifier 12 is subjected to processing such as down-conversion and analog-to-digital conversion before input to the inverse characteristic calculation unit 21.

For example, the inverse characteristic calculation unit 21 adjusts coefficients ($a_1$, $a_3$, and $a_5$) to minimize the sum of the squares of the absolute values ($\Sigma|\epsilon|^2$) of the error signal $\epsilon_i$ in the following equation (8) by using sample series (i.e., $u_i$ and $y_i$) at sample timing i (i=1 to N) in period T1. The inverse characteristic calculation unit 21 outputs $f(|y_i|^2)$ expressed by the adjusted coefficients or a lookup table to the distortion compensation unit 22 and the replica signal calculation unit 23.

$$u_i = a_1 y_i + a_3 |y_i|^2 y_i + a_5 |y_i|^4 y_i + \varepsilon_i \qquad (8)$$
$$= (a_1 + a_3 |y_i|^2 + a_5 |y_i|^4) y_i + \varepsilon_i$$
$$= f(|y_i|^2) y_i + \varepsilon_i$$

Figure 3:
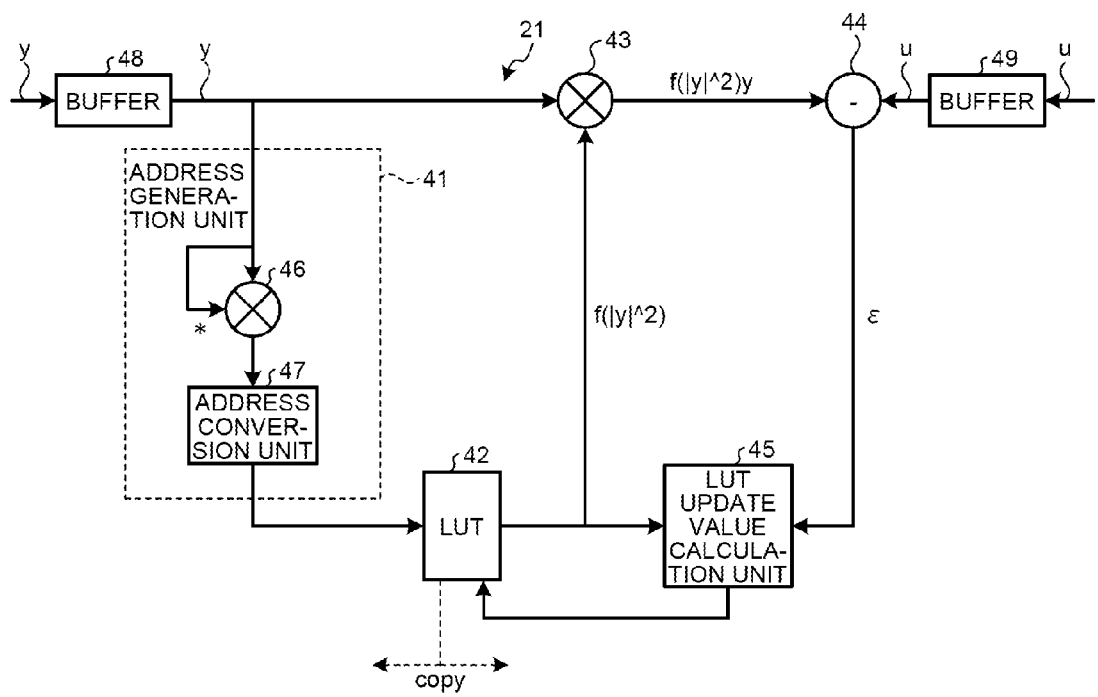
FIG. 3 is a block diagram illustrating an example of an inverse characteristic calculation unit according to the first embodiment.

FIG. 3 is a block diagram illustrating an example of the inverse characteristic calculation unit according to the first embodiment. In FIG. 3, the inverse characteristic calculation unit 21 includes an address generation unit 41, a lookup table (LUT) 42, a multiplication unit 43, a subtraction unit 44, an LUT update value calculation unit 45, and buffers 48 and 49.

The buffer 48 holds a combined signal series $y_T$ ($y_T=[y_1, y_2, \ldots, y_N]$) for each period T. Here, $y_1, y_2, \ldots, y_N$ each are a sample in period T.

The buffer 49 holds a predistortion signal series $u_T$ ($u_T=[u_1, u_2, \ldots, u_N]$) for each period T. Here, $u_1, u_2, \ldots, u_N$ each are a sample in period T.

As illustrated in FIG. 3, the address generation unit 41 includes a multiplication unit 46 and an address conversion unit 47. Assume that k=1 to N−1. The multiplication unit 46 multiplies the sample $y_k$ of the combined signal series $y_{T1}$ in period T1 held in the buffer 48 by the complex conjugate of the sample $y_k$ to determine a power value. The multiplication unit 46 then outputs the determined power value to the address conversion unit 47. The address conversion unit 47 outputs an address according to the value of the result of multiplication (i.e., power value) received from the multiplication unit 46 to the LUT 42. In other words, the address conversion unit 47 outputs an address according to the amplitude value of the sample $y_k$ of the combined signal series $y_{T1}$ to the LUT 42.

The LUT 42 stores a plurality of addresses and distortion compensation coefficients (i.e., $f(|y_i|^2)$) according to the respective addresses in association with each other. In other words, the LUT 42 stores the plurality of addresses and the "first inverse distortion characteristics" according to the respective addresses in association with each other. The LUT 42 outputs the distortion compensation coefficient associated with the address received from the address conversion unit 47 to the multiplication unit 43.

The multiplication unit 43 multiplies the sample $y_k$ of the combined signal series $y_{T1}$ by the distortion compensation coefficient output from the LUT 42, and outputs the result of multiplication to the subtraction unit 44.

The subtraction unit 44 calculates an error signal $\epsilon_k$ between the result of multiplication output from the multiplication unit 43 and the sample $u_k$ of the predistortion signal series $u_{T1}$ held in the buffer 49, and outputs the calculated error signal $\epsilon_k$ to the LUT update value calculation unit 45.

The LUT update value calculation unit 45 adjusts the coefficients ($a_1$, $a_3$, and $a_5$) to reduce the error signal $\epsilon_k$, and updates the LUT 42 with $f(|y_k|^2)$ expressed by the adjusted coefficients ($a_1$, $a_3$, and $a_5$).

Such update processing is then performed on the next sample $y_{k+1}$ of the combined signal series $y_{T1}$ and the next sample $u_{k+1}$ of the predistortion signal series $u_{T1}$. That is, the foregoing update processing is repeated with respect to the sample timing i (i=1 to N) in period T1.

When the update processing for the sample timing i (i=1 to N) in period T1 is completed, the LUT 42 outputs (i.e., copies) a correspondence table of the plurality of addresses and the distortion compensation coefficients (i.e., $f(|y_i|^2)$) according to the respective addresses, stored in the LUT 42, to the distortion compensation unit 22 and the replica signal calculation output unit 23.

Return to the description of FIG. 2. The distortion compensation unit 22 inputs a baseband signal series x to be transmitted. The distortion compensation unit 22 multiplies the baseband signal series x by the foregoing "first inverse distortion characteristics" determined in period T1 to generate a predistortion signal series u, and outputs the generated predistortion signal series u to the outphasing amplifier 12.

Figure 4:
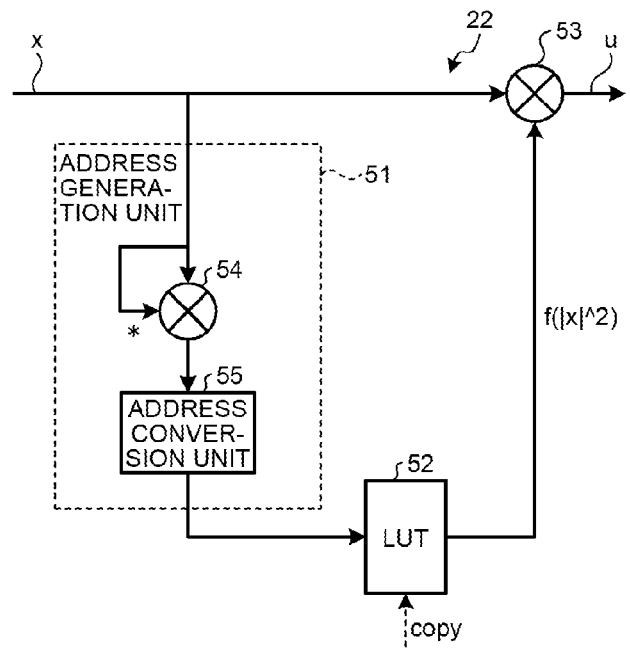
FIG. 4 is a block diagram illustrating an example of a distortion compensation unit according to the first embodiment.

FIG. 4 is a block diagram illustrating an example of the distortion compensation unit according to the first embodiment. In FIG. 4, the distortion compensation unit 22 includes an address generation unit 51, an LUT 52, and a multiplication unit 53.

As illustrated in FIG. 4, the address generation unit 51 includes a multiplication unit 54 and an address conversion unit 55. The multiplication unit 54 multiplies a sample $x_k$ of the baseband signal series x by the complex conjugate of the sample $x_k$ to determine a power value. The multiplication unit 54 then outputs the determined power value to the address conversion unit 55. The address conversion unit 55 outputs an address according to the value of the result of multiplication (i.e., power value) received from the multiplication unit 54 to the LUT 52. In other words, the address conversion unit 55 outputs an address according to the amplitude value of the sample $x_k$ of the baseband signal series x to the LUT 52.

The LUT 52 stores the correspondence table copied from the LUT 42 (i.e., the correspondence table updated in period T1). The LUT 52 outputs the distortion compensation coefficient associated with the address output from the address conversion unit 55 to the multiplication unit 53.

The multiplication unit 53 multiplies the sample $x_k$ of the baseband signal series x by the distortion compensation coefficient output from the LUT 52, and outputs the result of multiplication (i.e., sample $u_k$ of the predistortion signal series u) to the outphasing amplifier 12.

Return to the description of FIG. 2. The replica signal calculation unit 23 calculates a replica signal series ya of a first branch signal series ua based on the "first inverse distortion characteristics," a second branch signal series ub, and the output signal of the outphasing amplifier 12 (i.e., the combined signal series y which is the output signal of the combination unit 34). That is, a "first branch" of the outphasing amplifier 12 refers to the branch where the nonlinear amplifier 32 is arranged. A "second branch" refers to the branch where the nonlinear amplifier 33 is arranged. Although omitted in FIG. 2, the combined signal series y which is the output signal of the outphasing amplifier 12 is subjected to processing such as down-conversion and analog-to-digital conversion before input to the replica signal calculation unit 23.

Figure 5:
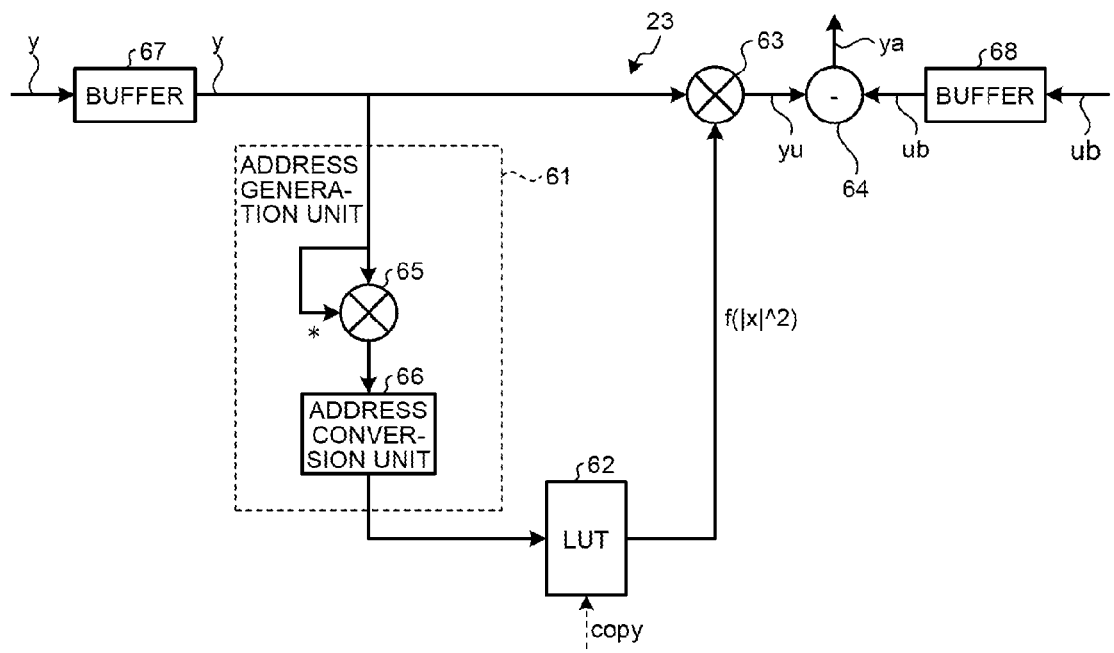
FIG. 5 is a block diagram illustrating an example of a replica signal calculation unit according to the first embodiment.

FIG. 5 is a block diagram illustrating an example of the replica signal calculation unit according to the first embodiment. In FIG. 5, the replica signal calculation unit 23 includes an address generation unit 61, an LUT 62, a multiplication unit 63, a subtraction unit 64, and buffers 67 and 68.

The buffer 67 holds the combined signal series $y_T$ ($y_T$=[$y_1$, $y_2$, . . . , $y_N$]) for each period T. Here, $y_1$, $y_2$ . . . , $y_N$ each are a sample in period T.

The buffer 68 holds a second branch signal series $ub_T$ ($ub_T$=[$ub_1$, $ub_2$, . . . , $ub_N$]) for each period T. Here, $ub_1$, $ub_2$, . . . , $ub_N$ each are a sample in period T.

As illustrated in FIG. 5, the address generation unit 61 includes a multiplication unit 65 and an address conversion unit 66. The multiplication unit 65 multiplies the sample $y_k$ of the combined signal series y in period T1, held in the buffer 67, by the complex conjugate of the sample $y_k$ to determine a power value. The multiplication unit 65 then outputs the determined power value to the address conversion unit 66. The address conversion unit 66 outputs an address according to the value of the result of multiplication (i.e., power value) received from the multiplication unit 65 to the LUT 62. In other words, the address conversion unit 66 outputs an address according to the amplitude value of the sample $y_k$ of the combined signal series y to the LUT 62.

The LUT 62 stores the correspondence table copied from the LUT 42 (i.e., the correspondence table updated in period T1). The LUT 62 then outputs the distortion compensation coefficient associated with the address output from the address conversion unit 66 to the multiplication unit 63.

The multiplication unit 63 multiplies the sample $y_k$ of the combined signal series y by the distortion compensation coefficient output from the LUT 62, and outputs the result of multiplication $yu_k$ to the subtraction unit 64. Here, the result of multiplication $yu_k$ output from the multiplication unit 63 corresponds the replica signal of the input signal of the outphasing amplifier 12, i.e., the sample $u_k$ of the predistortion signal series u.

The subtraction unit 64 calculates a difference between the result of multiplication $yu_k$ output from the multiplication unit 63 and the sample $ub_k$ of the second branch signal series ub held in the buffer 68, thereby calculating a replica signal $ya_k$ of a sample $ua_k$ of the first branch signal series ua.

Return to the description of FIG. 2. The correction amount calculation unit 24 calculates the inverse characteristic of the distortion characteristic of the nonlinear amplifier 32, i.e., an inverse branch characteristic of the first branch (hereinafter, may be referred to as a "second inverse distortion characteristic") as a "balance correction amount." The correction amount calculation unit 24 calculates the balance correction amount based on an adjusted first branch signal series ua' of which a phase and an amplitude are adjusted by the adjustment unit 25 and the replica signal series ya of the first branch signal series ua which is calculated by the replica signal calculation unit 23.

For example, the correction amount calculation unit 24 adjusts the coefficients ($a_1$, $a_3$, and $a_5$) to minimize the sum of the squares of the absolute values ($\Sigma|\epsilon|^2$) of the error signal $\epsilon_i$ in the following equation (9) by using the sample series (namely, $ua'_i$ and $ya_i$) in period T1 including sample timing i (i=1 to N). The correction amount calculation unit 24 outputs $f(|ya_i|^2)$ expressed by the adjusted coefficients or a lookup table to the adjustment unit 25.

$$ua'_i = a_1 ya_i + a_3|ya_i|^2 ya_i + a_5|ya_i|^4 ya_i + \varepsilon_i \quad (9)$$
$$= (a_l + a_3|ya_i|^2 + a_5|ya_i|^4)ya_i + \varepsilon_i$$
$$= f(|ya_i|^2)ya_i + \varepsilon_i$$

Figure 6:
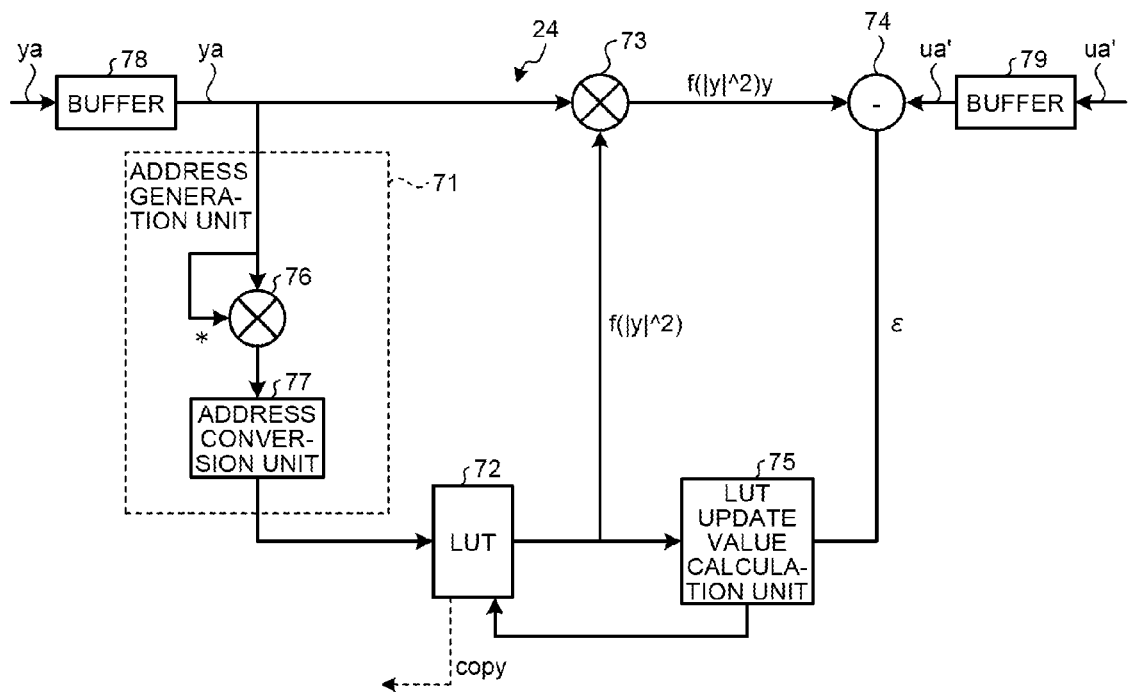
FIG. 6 is a block diagram illustrating an example of a correction amount calculation unit according to the first embodiment.

FIG. 6 is a block diagram illustrating an example of the correction amount calculation unit according to the first embodiment. In FIG. 6, the correction amount calculation unit 24 includes an address generation unit 71, an LUT 72, a multiplication unit 73, a subtraction unit 74, an LUT update value calculation unit 75, and buffers 78 and 79.

The buffer 78 holds a replica signal series $ya_T$ ($ya_T=[ya_1, ya_2, \ldots, ya_N]$) of the first branch signal series ua for each period T. Here, $ya_1, ya_2, \ldots, ya_N$ each are a sample in period T.

The buffer 79 holds the adjusted first branch signal series $ua'_T$ ($ua'_T=[ua'_1, ua'_2, \ldots, ua'_N]$) for each period T. Here, $ua'_1, ua'_2, \ldots, ua'_N$ each are a sample in period T.

As illustrated in FIG. 6, the address generation unit 71 includes a multiplication unit 76 and an address conversion unit 77. The multiplication unit 76 multiplies the replica signal $ya_k$ of the sample $ua_k$ of the first branch signal series ua in period T1, held in the buffer 78, by the complex conjugate of the replica signal $ya_k$ to determine a power value. The multiplication unit 76 outputs the determined power value to the address conversion unit 77. The address conversion unit 77 outputs an address according to the value of the result of multiplication (i.e., power value) received from the multiplication unit 76 to the LUT 72. In other words, the address conversion unit 77 outputs an address according to the amplitude value of the replica signal $ya_k$ of the sample $ua_k$ of the first branch signal series ua to the LUT 72.

The LUT 72 stores a plurality of addresses and distortion compensation coefficients (i.e., $f(|ya_i|^2)$) according to the respective addresses in association with each other. In other words, the LUT 72 stores the plurality of addresses and "second inverse distortion characteristics" according to the respective addresses in association with each other. The LUT 72 outputs the distortion compensation coefficient associated with the address received from the address conversion unit 77 to the multiplication unit 73.

The multiplication unit 73 multiplies the replica signal $ya_k$ of the sample $ua_k$ of the first branch signal series ua in period T1 by the distortion compensation coefficient output from the LUT 72, and outputs the result of multiplication to the subtraction unit 74.

The subtraction unit 74 calculates an error signal $\epsilon_k$ between the result of multiplication output from the multiplication unit 73 and the sample $ua'_k$ of the adjusted first branch signal series ua', and outputs the calculated error signal $\epsilon_k$ to the LUT update value calculation unit 75.

The LUT update value calculation unit 75 adjusts the coefficients ($a_1$, $a_3$, and $a_5$) to reduce the error signal $\epsilon_k$, and updates the LUT 72 with $f(|ya_i|^2)$ expressed by the adjusted coefficients ($a_1$, $a_3$, and $a_5$).

Such update processing is then performed on the replica signal $ya_{k+1}$ of the next sample $ua_{k+1}$ of the first branch signal series ua and the next sample $ua'_{k+1}$ of the adjusted first branch signal series ua'. In other words, the foregoing update processing is repeated with respect to the sample timing i (i=1 to N) in period T1.

When the update processing for the sample timing i (i=1 to N) in period T1 is completed, the LUT 72 outputs (i.e., copies) the correspondence table of the plurality of addresses and the distortion compensation coefficients (i.e., $f(|ya_i|^2)$) according to the respective addresses, stored in the LUT 72, to the adjustment unit 25.

Return to the description of FIG. 2. The adjustment unit 25 inputs the first branch signal series ua. The adjustment unit 25 then multiplies it by the foregoing "second inverse distortion characteristics" determined in period T1 to generate a branch predistortion signal series ua'. The adjustment unit 25 outputs the generated branch predistortion signal series ua' to the correction amount calculation unit 24 and the nonlinear amplifier 32. Although omitted in FIG. 2, the branch predistortion signal series ua' output from the adjustment unit 25 is subjected to processing such as digital-to-analog conversion and up-conversion before input to the nonlinear amplifier 32. Meanwhile, the branch predistortion signal series ua' output to the adjustment unit 25 is simply input into the correction amount calculation unit 24 as a digital signal.

Figure 7:
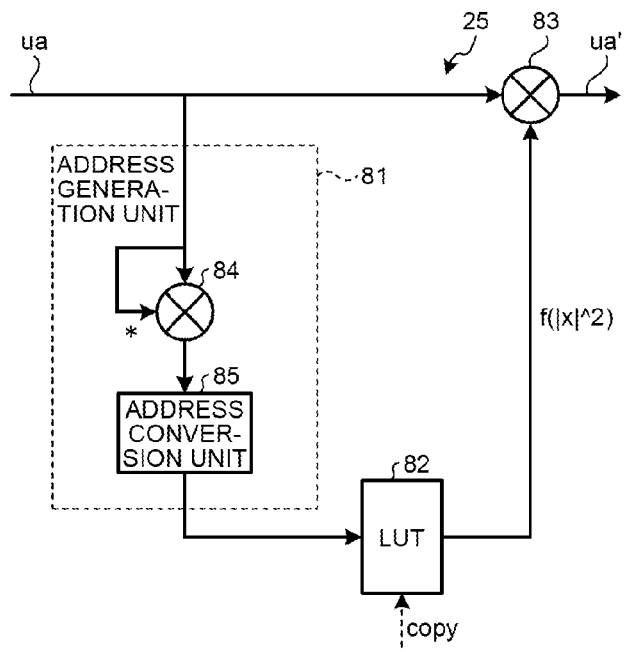
FIG. 7 is a block diagram illustrating an example of an adjustment unit according to the first embodiment.

FIG. 7 is a block diagram illustrating an example of the adjustment unit according to the first embodiment. In FIG. 7, the adjustment unit 25 includes an address generation unit 81, an LUT 82, and a multiplication unit 83.

As illustrated in FIG. 7, the address generation unit 81 includes a multiplication unit 84 and an address conversion unit 85. The multiplication unit 84 multiplies the sample $ua_k$ of the first branch signal series ua by the complex conjugate of the sample $ua_k$ to determine a power value. The multiplication unit 84 then outputs the determined power value to the address conversion unit 85. The address conversion unit 85 outputs an address according to the value of the result of multiplication (i.e., power value) received from the multiplication unit 84 to the LUT 82. In other words, the address conversion unit 85 outputs an address according to the amplitude value of the sample $ua_k$ of the first branch signal series ua to the LUT 82.

The LUT 82 stores the correspondence table copied from the LUT 72 (i.e., the correspondence table updated in period T1). The LUT 82 then outputs the distortion compensation coefficient associated with the address output from the address conversion unit 85 to the multiplication unit 83.

The multiplication unit 83 multiplies the sample $ua_k$ of the first branch signal series ua by the distortion compensation coefficient output from the LUT 82, and outputs the result of multiplication (i.e., sample $ua'_k$ of the branch predistortion signal series ua').

Operation Example of Wireless Transmission Apparatus

Figure 8:
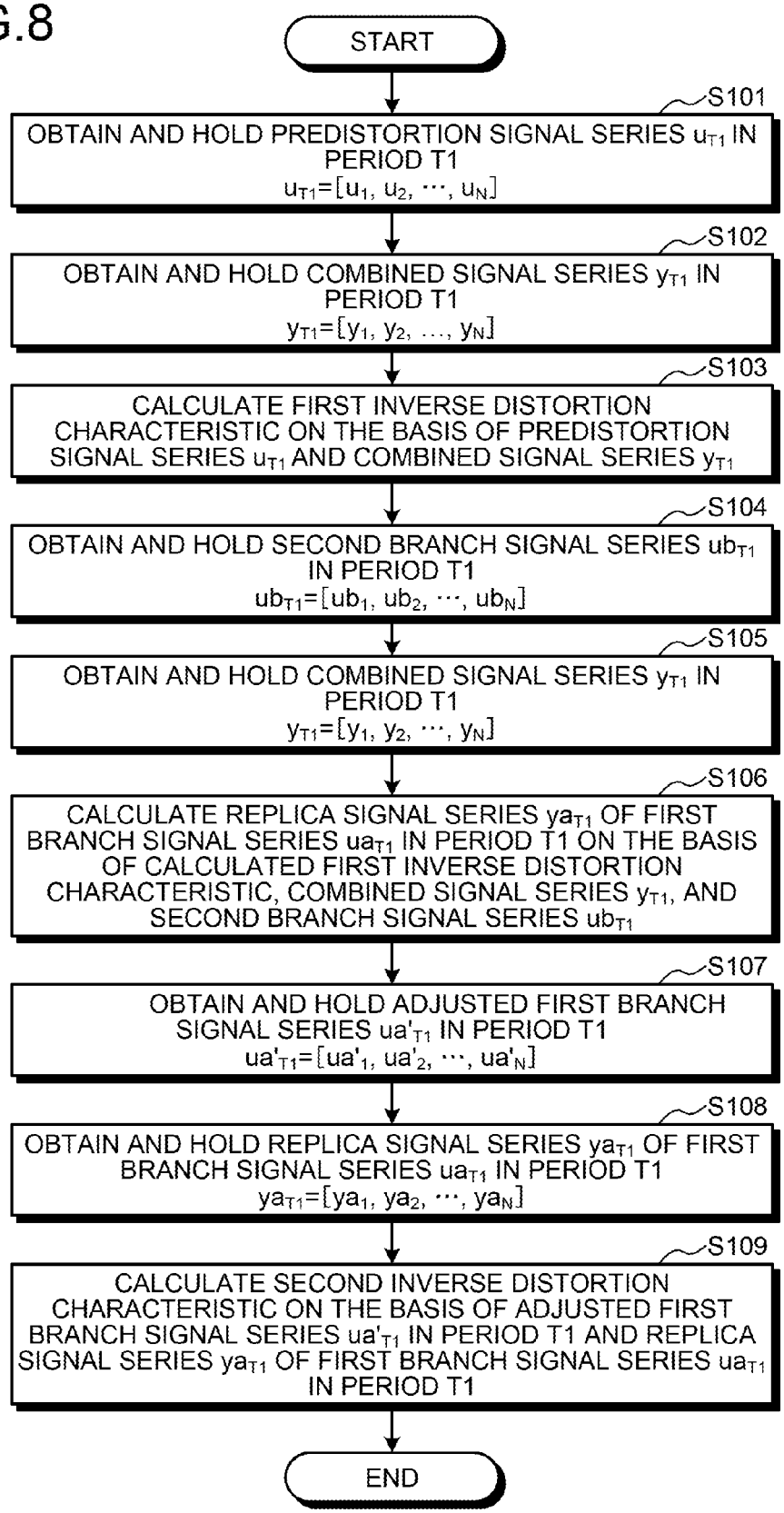
FIG. 8 is a flowchart illustrating an example of a processing operation of the wireless transmission apparatus according to the first embodiment.

An example of a processing operation of the wireless transmission apparatus 10 having the foregoing configuration will be described. FIG. 8 is a flowchart illustrating an example of the processing operation of the wireless transmission apparatus according to the first embodiment.

In the distortion compensation device 11 of the wireless transmission apparatus 10, the inverse characteristic calculation unit 21 obtains and holds the predistortion signal series $u_{T1}$ (i.e., samples $u_i$: i=1 to N) in period T1 (step S101). The sample signal $u_i$ of the predistortion signal series $u_{T1}$ is the output signal of the distortion compensation unit 22 with the sample $x_i$ of the baseband signal series x in period T1 as an input.

The inverse characteristic calculation unit 21 obtains and holds the combined signal series $y_{T1}$ (i.e., samples $y_i$: i=1 to N) which is the predistortion signal series $u_{T1}$ in period T1 amplified by the outphasing amplifier 12 and output from the outphasing amplifier 12 (step S102). As described above, the combined signal series $y_{T1}$ which is the output signal of the combination unit 34 is subjected to down-conversion and analog-to-digital conversion before held in the inverse characteristic calculation unit 21.

The inverse characteristic calculation unit 21 calculates the inverse characteristic of the distortion characteristic of the entire outphasing amplifier 12, i.e., the foregoing first inverse distortion characteristic based on the predistortion signal series $u_{T1}$ and the combined signal series $y_{T1}$ held in steps S101 and S102 (step S103). More specifically, as described above, the inverse characteristic calculation unit 21 adjusts the coefficients ($a_1$, $a_3$, and $a_5$) to minimize the sum of the squares of the absolute values of the error signal $\epsilon_i$ in the foregoing equation (8) by using the sample series (i.e., $u_i$ and $y_i$) in the sample timing i (i=1 to N) in period T1 to calculate $f(|y_i|^2)$ expressed by the adjusted coefficients.

The replica signal calculation unit 23 obtains and holds the second branch signal series $ub_{T1}$ (i.e., samples $ub_i$: i=1 to N) in period T1 (step S104).

The replica signal calculation unit 23 obtains and holds the combined signal series $y_{T1}$ (i.e., sample signals $y_i$: i=1 to N) in period T1 (step S105).

The replica signal calculation unit 23 calculates the replica signal series $ya_{T1}$ (i.e., samples $ya_i$: i=1 to N) of the first branch signal series $ua_{T1}$ (i.e., samples $ua_i$: i=1 to N) in period T1 based on the first inverse distortion characteristic calculated in step S103, the combined signal series $y_{T1}$ which is the output signal of the combination unit 34, and the second branch signal series $ub_{T1}$ in period T1 (step S106). Here, the sample $ua_i$ of the first branch signal series $ua_{T1}$ in period T1 is the one output to the first branch between the two branch signals into which the sample $u_i$ of the predistortion signal series $u_{11}$ is decomposed by the signal component separation unit 31. The sample $ub_i$ of the second branch signal series $ub_{T1}$ in period T1 is the one output to the second branch between the two branch signals into which the sample $u_i$ of the predistortion signal series $u_{T1}$ is decomposed by the signal component separation unit 31.

The correction amount calculation unit 24 obtains and holds the adjusted first branch signal series $ua'_{T1}$ (i.e., samples $ua'_i$: i=1 to N) in period T1 (step S107).

The correction amount calculation unit 24 obtains and holds the replica signal series $ya_{T1}$ (i.e., replica signal $ya_i$: i=1 to N) of the first branch signal series $ua_{T1}$ (i.e., samples $ua_i$: i=1 to N) in period T1 (step S108).

The correction amount calculation unit 24 calculates the inverse characteristic of the distortion characteristic of the nonlinear amplifier 32, i.e., the foregoing second inverse distortion characteristic based on the adjusted first branch signal series $ua'_{T1}$ in period T1 and the replica signal series $ya_{T1}$ of the first branch signal series $ua_{T1}$ in period T1, obtained by the replica signal calculation unit 23 (step S109). More specifically, as described above, the correction amount calculation unit 24 adjusts the coefficients ($a_1$, $a_3$, and $a_5$) to minimize the sum of the squares of the absolute values of the error signal $\epsilon_i$ in the foregoing equation (9) by using the sample series (i.e., $ua'_i$ and $ya_i$) in the sample timing i (i=1 to N) in period T1 to calculate $f(|ya_i|^2)$ expressed by the adjusted coefficients. In short, the correction amount calculation unit 24 identifies a balance correction amount between the branches.

The distortion compensation unit 22 then multiplies the baseband signal series x after period T1 by the first inverse distortion characteristic calculated in step S103 to output the predistortion signal series u. The adjustment unit 25 multiplies the first branch signal series ua after period T1 by the second inverse distortion characteristic calculated in step S109 to output the branch predistortion signal series ua'. The processing of steps S101 to S109 is then performed by using the signals after period T1.

Figure 9:
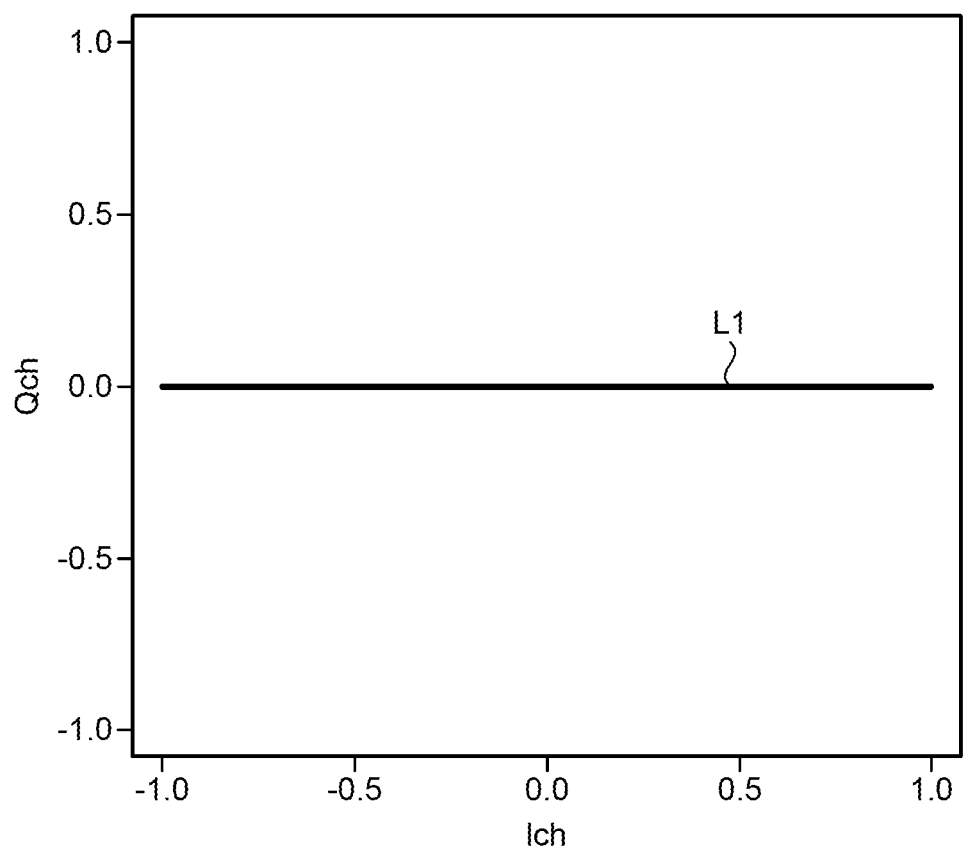
FIG. 9 is a diagram (part 1) illustrating a state of an input signal of the distortion compensation unit.
Figure 10:
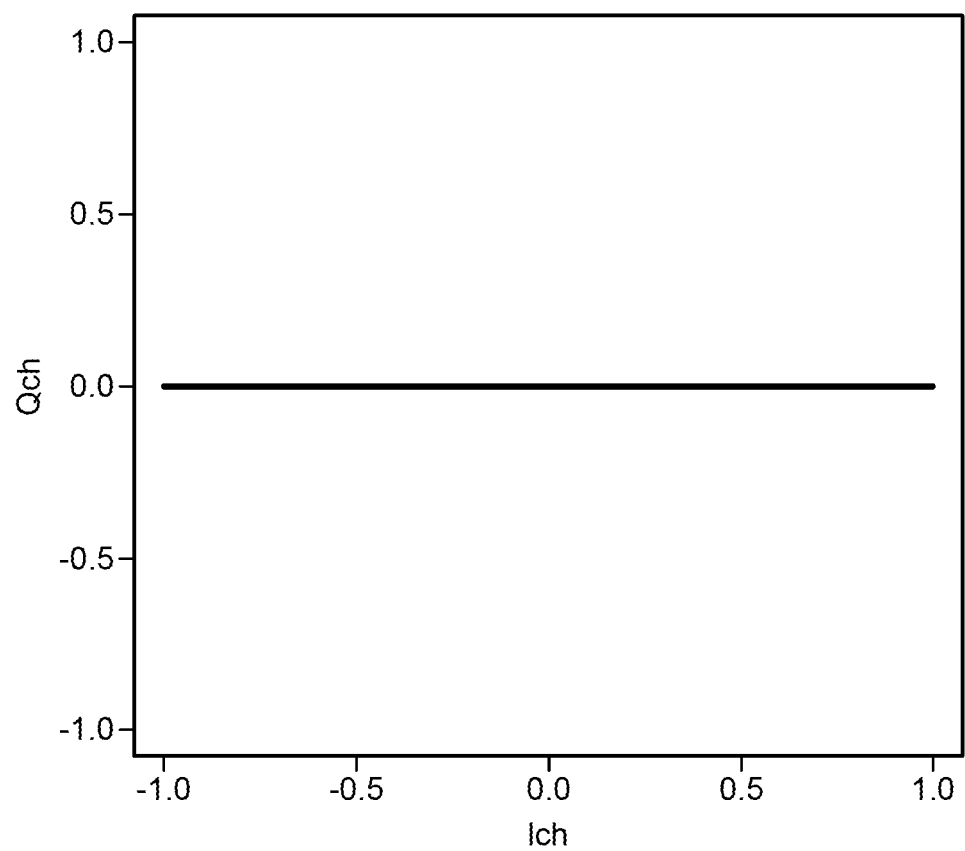
FIG. 10 is a diagram (part 1) illustrating a state of an output signal of the distortion compensation unit.
Figure 11:
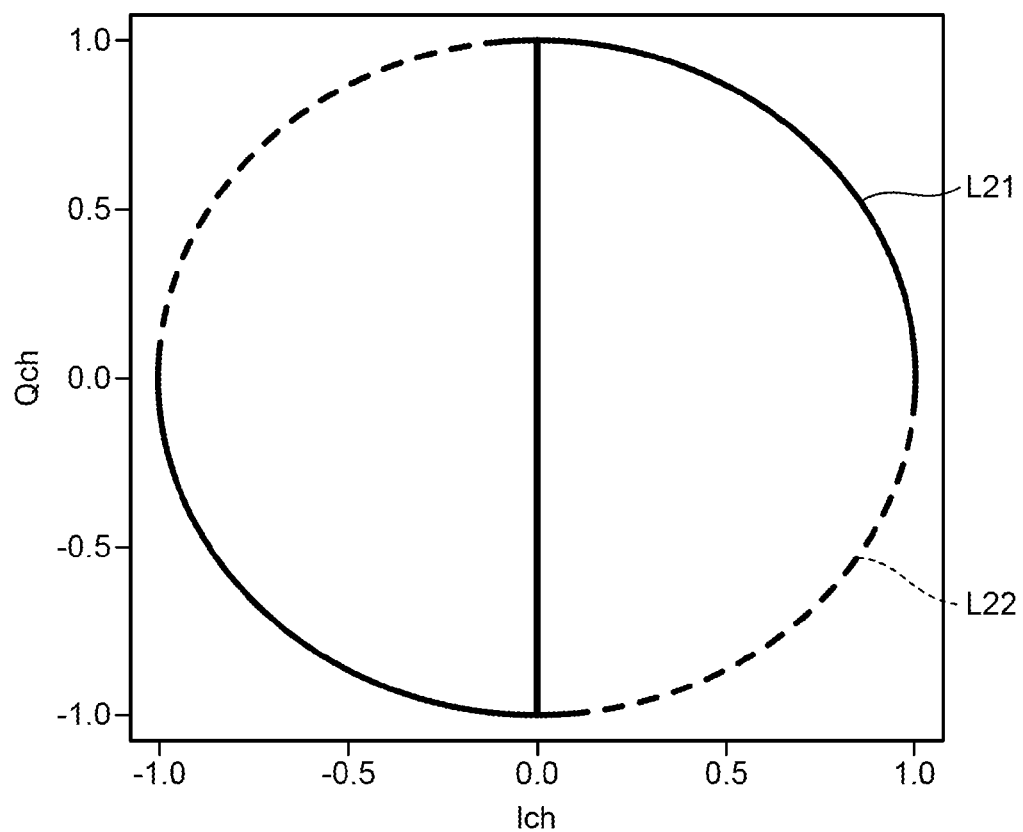
FIG. 11 is a diagram (part 1) illustrating a state of output signals of a signal component separation unit.
Figure 12:
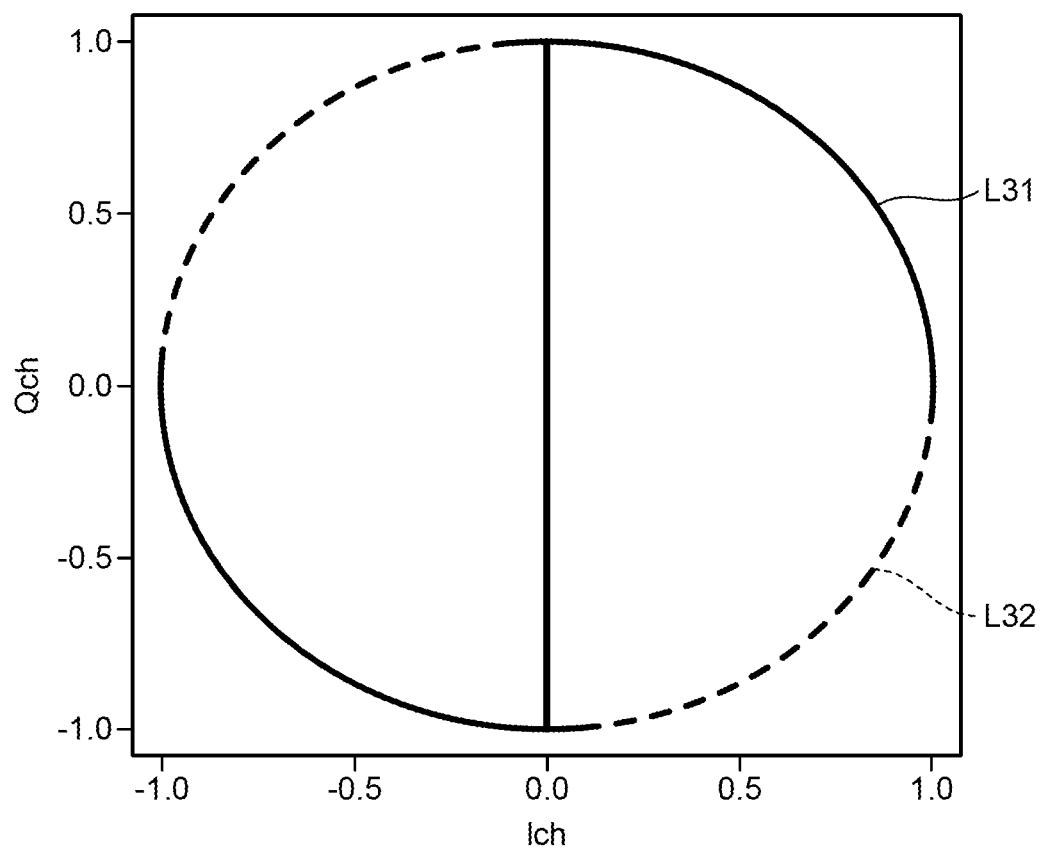
FIG. 12 is a diagram (part 1) illustrating a state of input signals to nonlinear amplifiers.
Figure 13:
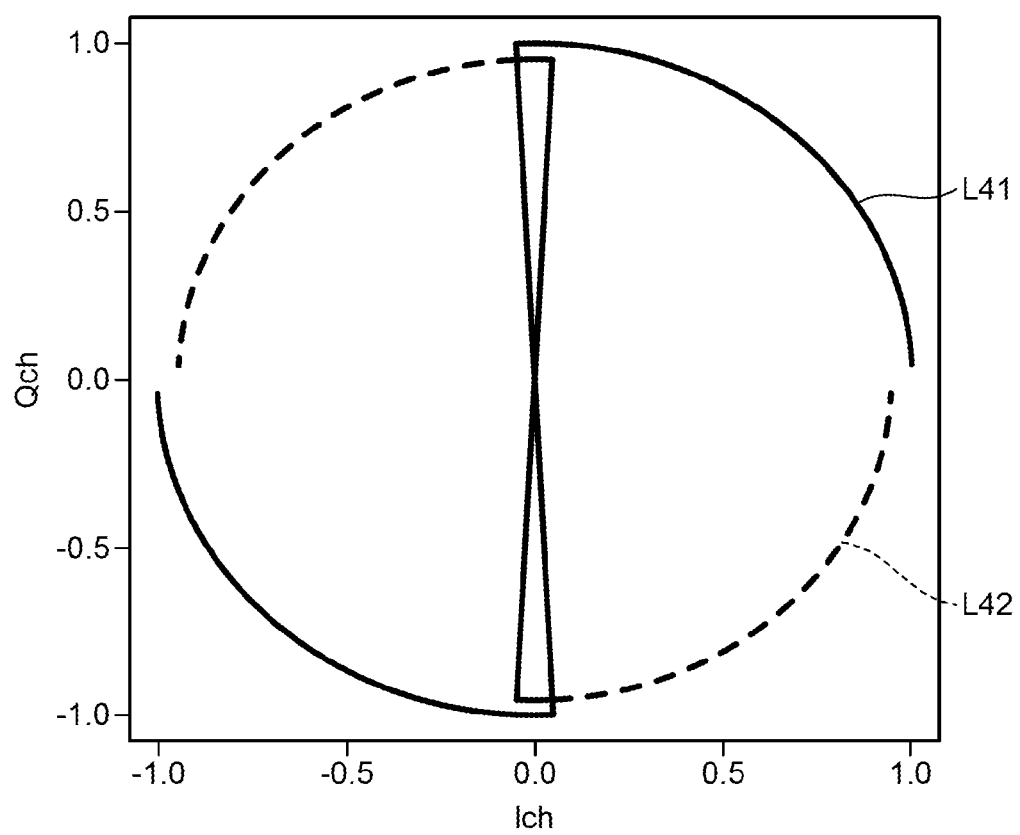
FIG. 13 is a diagram (part 1) illustrating a state of output signals of the nonlinear amplifiers.
Figure 14:
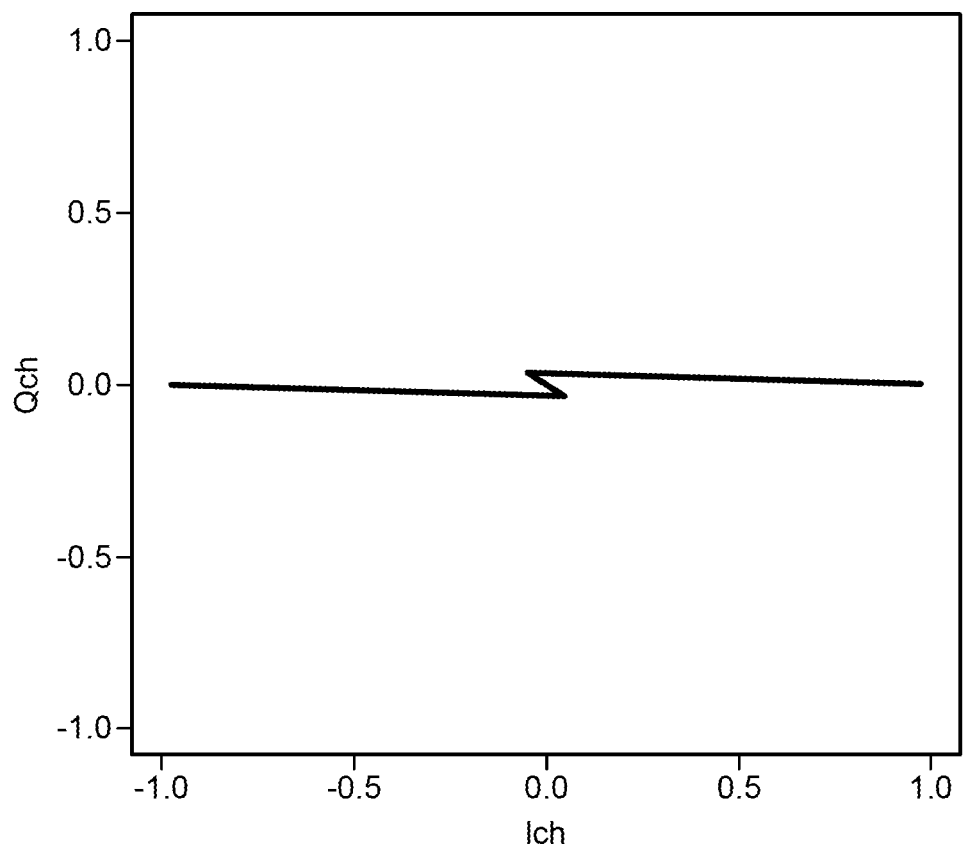
FIG. 14 is a diagram (part 1) illustrating a state of an output signal of a combination unit.
Figure 15:
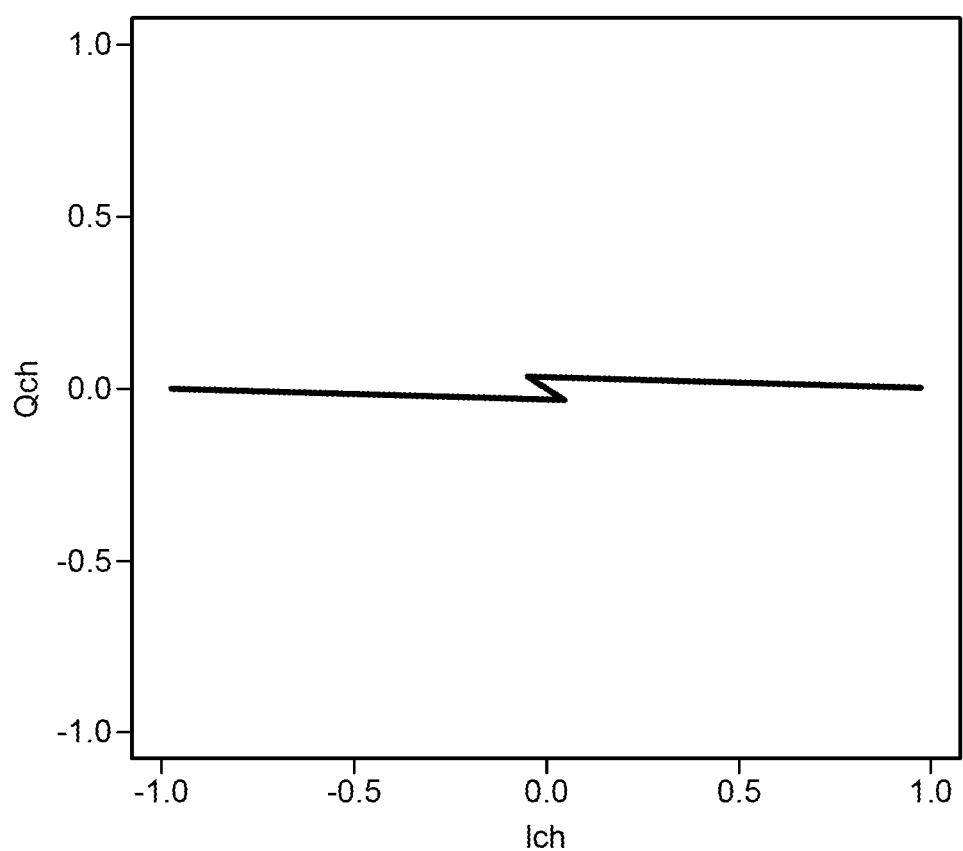
FIG. 15 is a diagram (part 1) illustrating a state of an output signal of a multiplication unit of the replica signal calculation unit.
Figure 16:
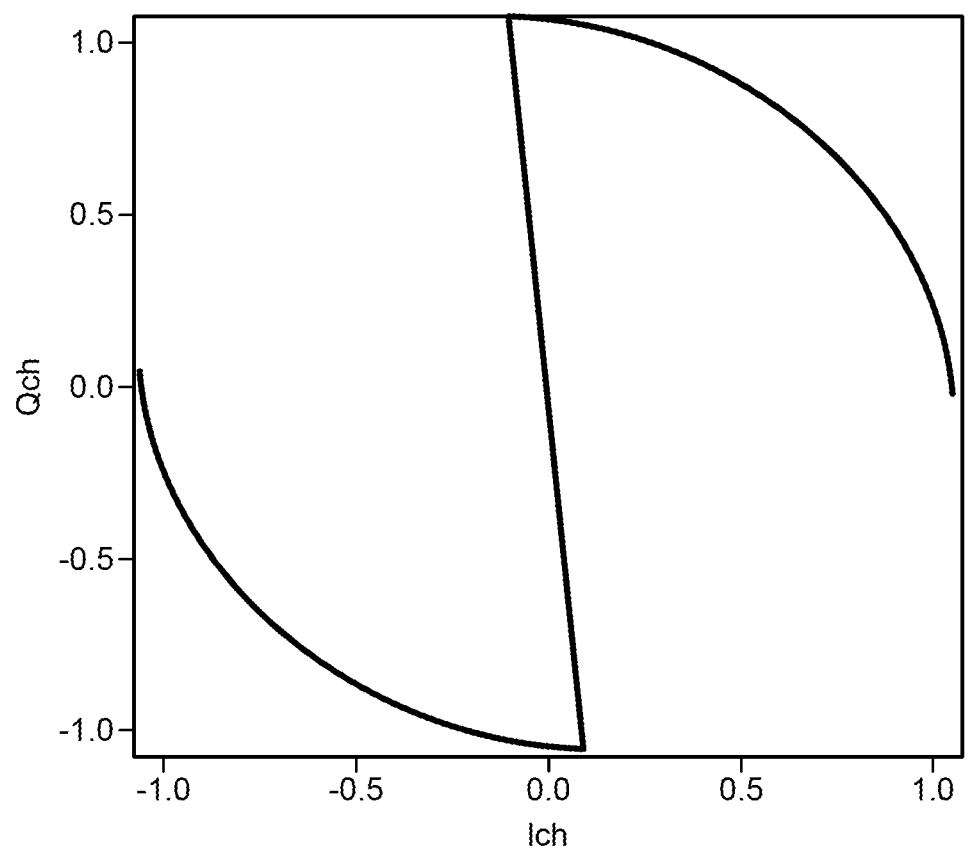
FIG. 16 is a diagram (part 1) illustrating a state of an output signal of a subtraction unit of the replica signal calculation unit.
Figure 17:
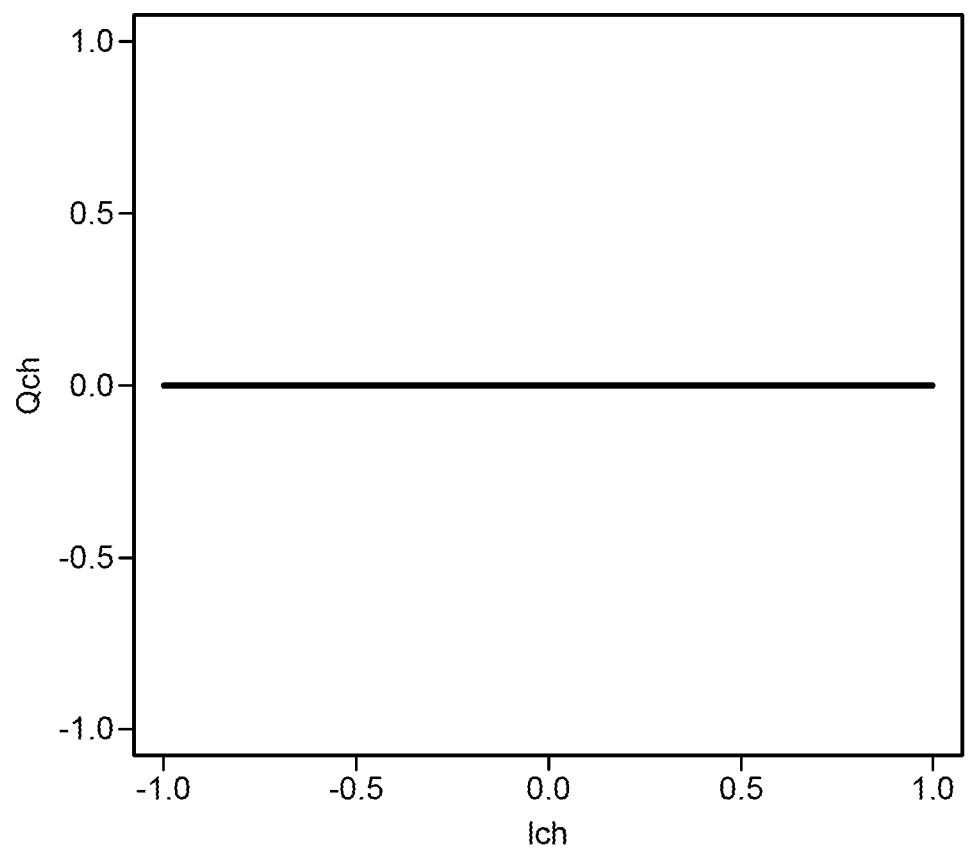
FIG. 17 is a diagram (part 2) illustrating the state of the input signal of the distortion compensation unit.
Figure 18:
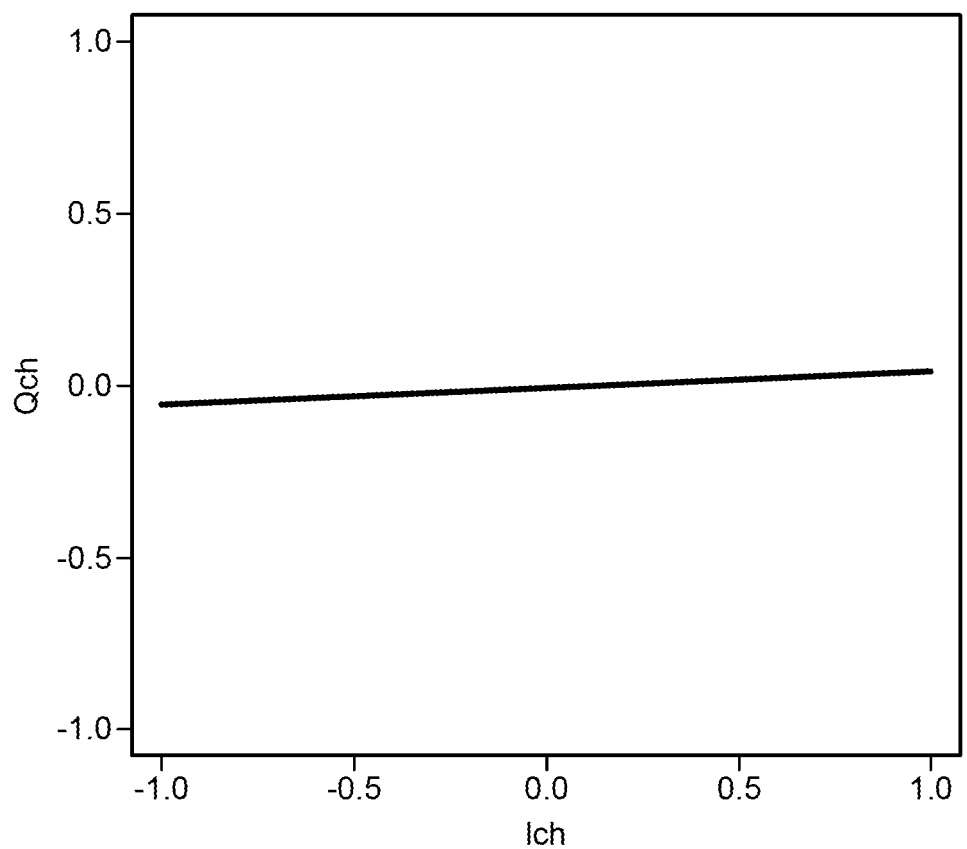
FIG. 18 is a diagram (part 2) illustrating the state of the output signal of the distortion compensation unit.
Figure 19:
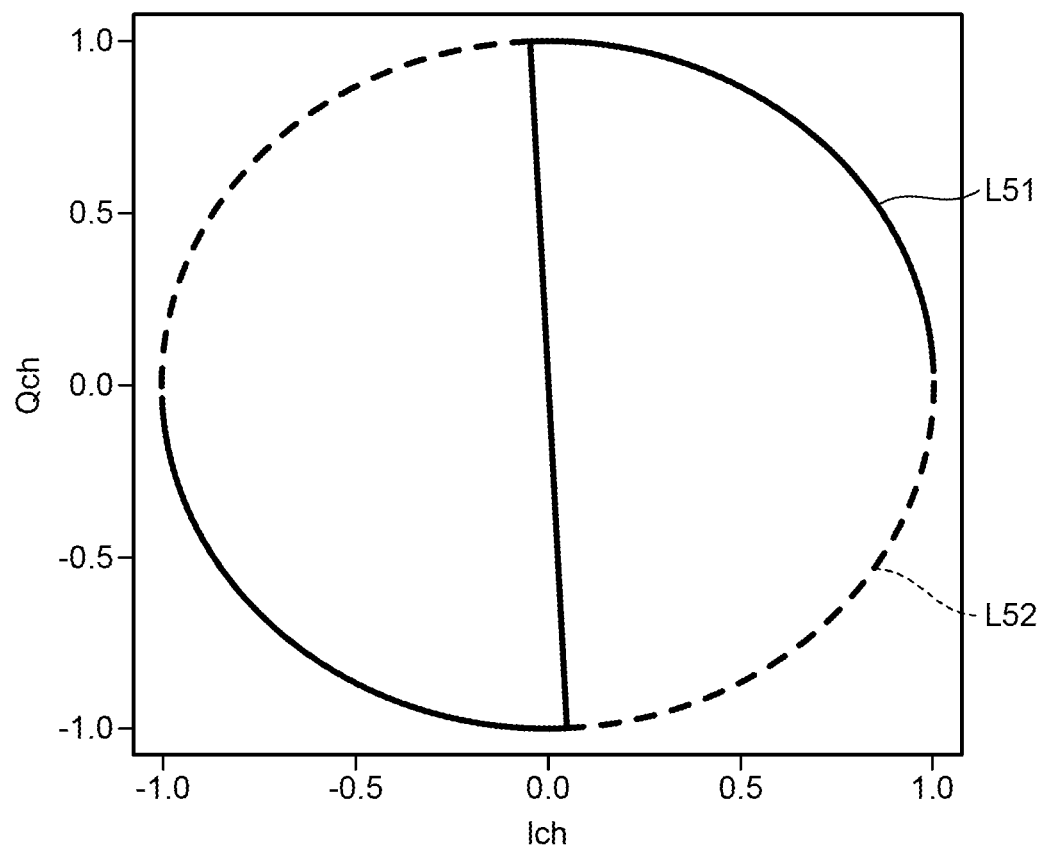
FIG. 19 is a diagram (part 2) illustrating the state of the output signals of the signal component separation unit.
Figure 20:
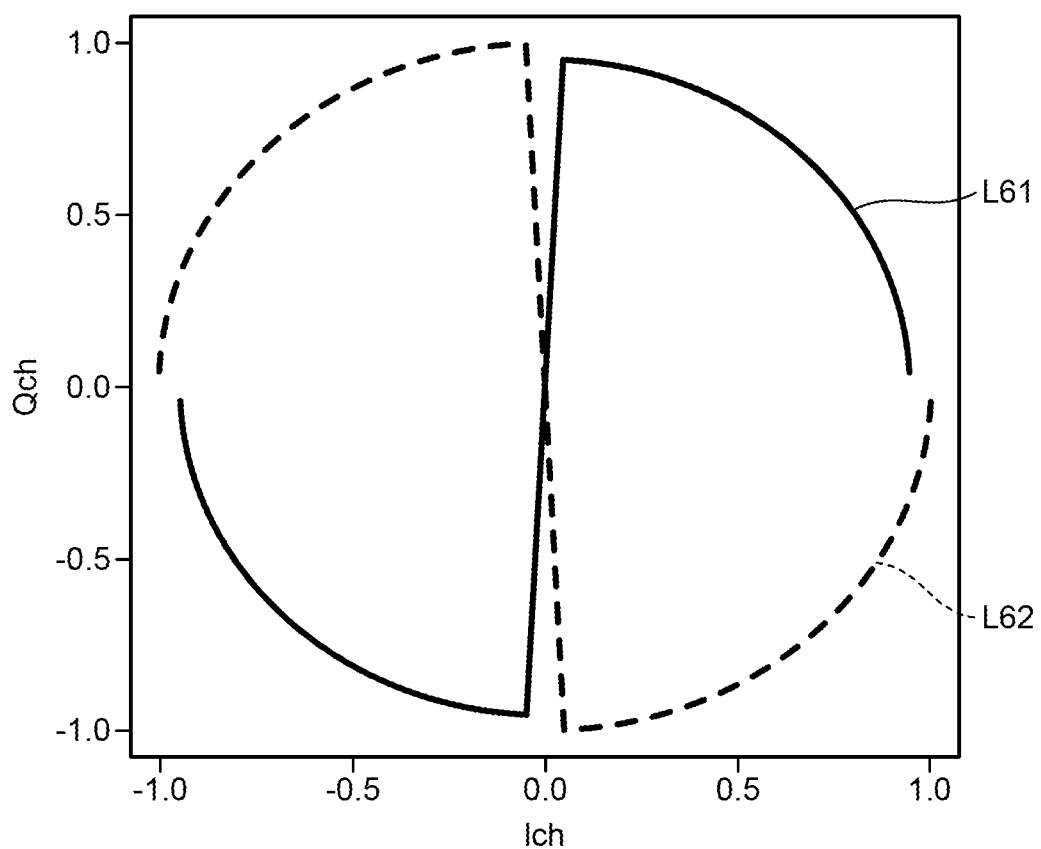
FIG. 20 is a diagram (part 2) illustrating the state of the input signals to the nonlinear amplifiers.
Figure 21:
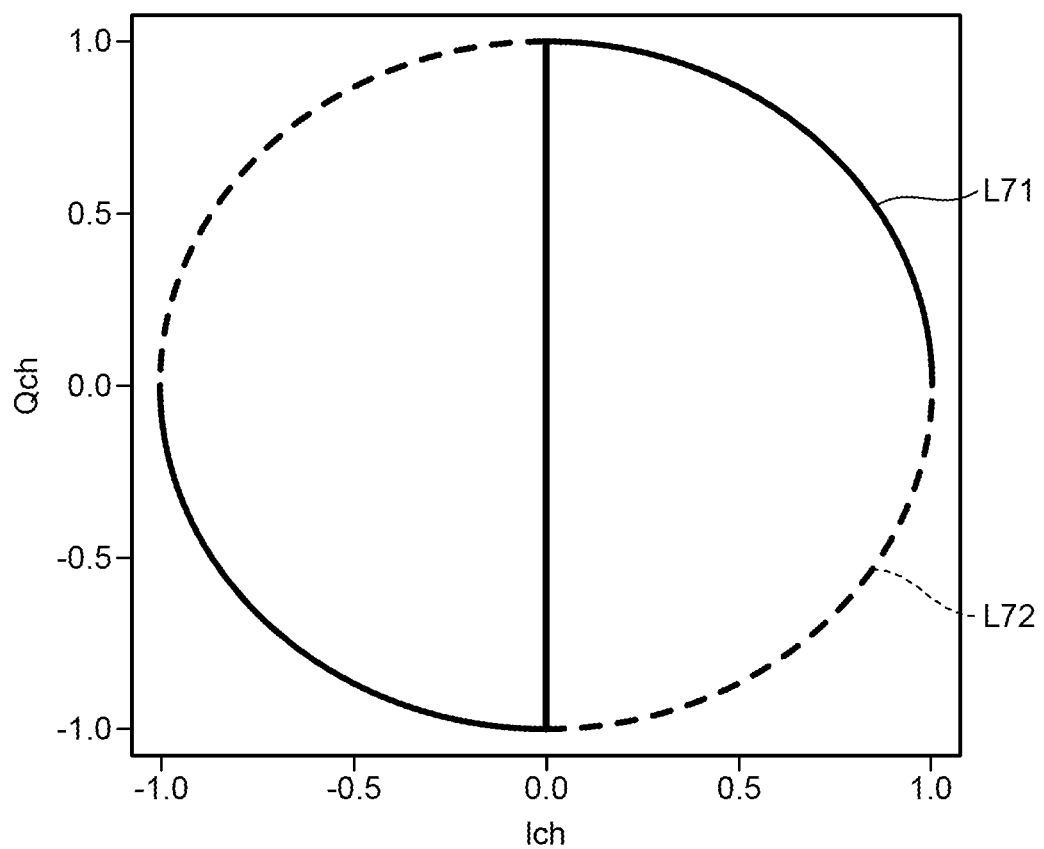
FIG. 21 is a diagram (part 2) illustrating the state of the output signals of the nonlinear amplifiers.
Figure 22:
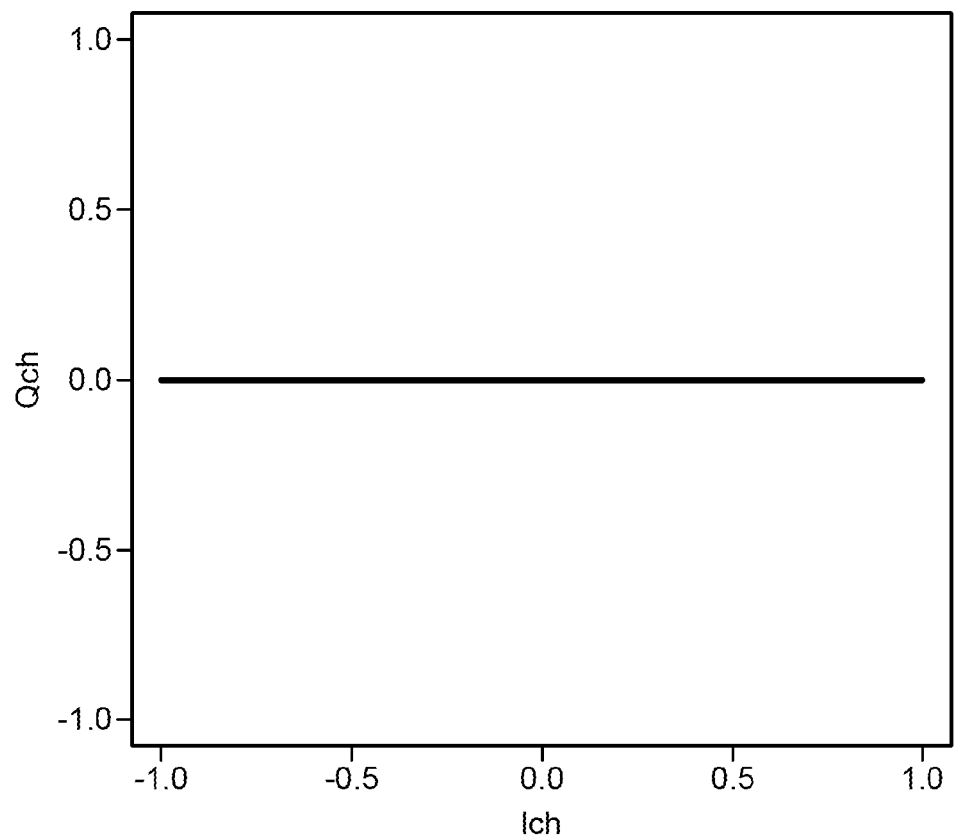
FIG. 22 is a diagram (part 2) illustrating the state of the output signal of the combination unit.
Figure 23:
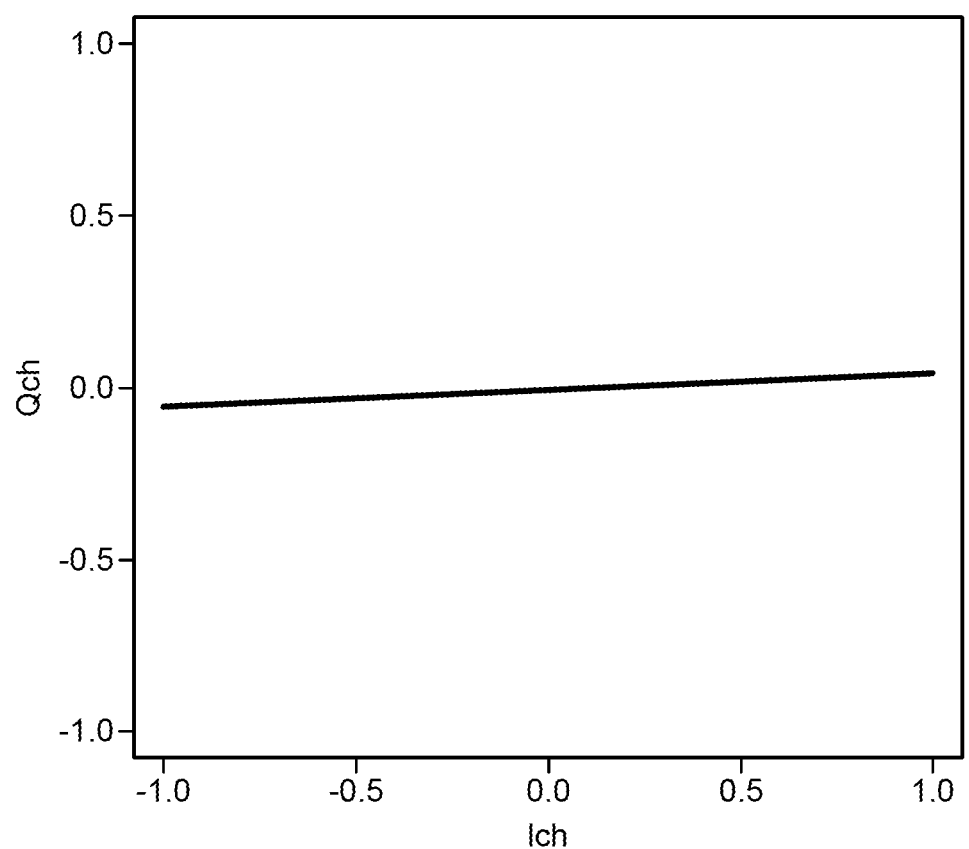
FIG. 23 is a diagram (part 2) illustrating the state of the output signal of the multiplication unit of the replica signal calculation unit.
Figure 24:
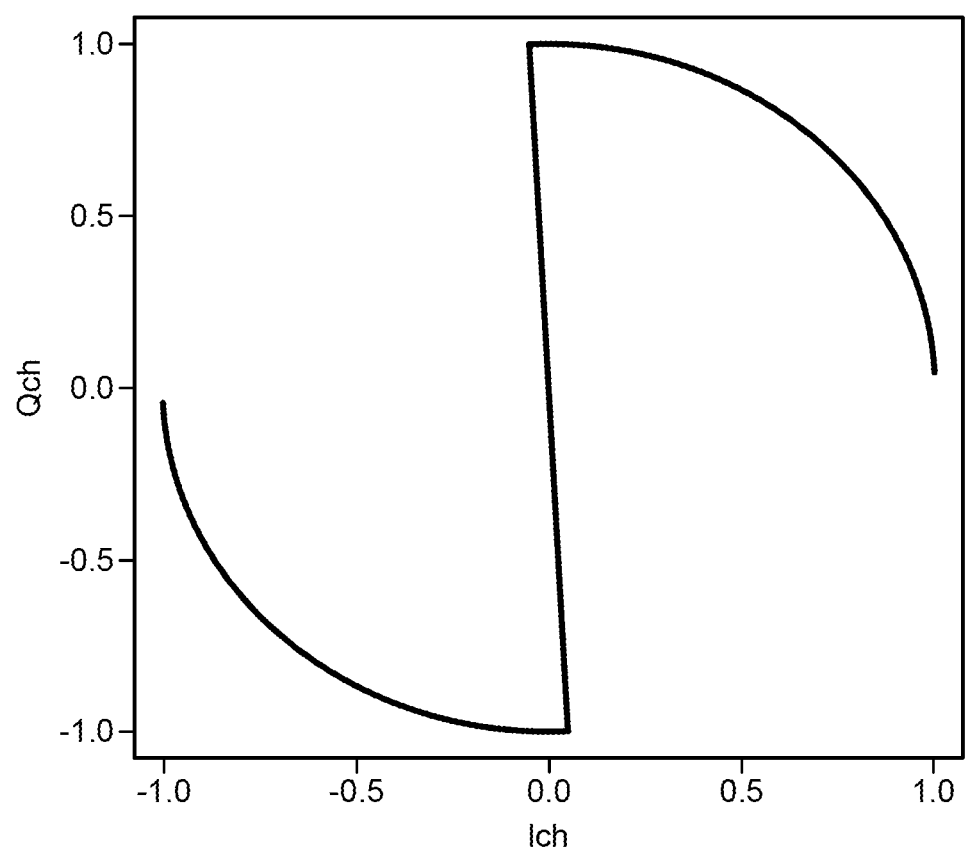
FIG. 24 is a diagram (part 2) illustrating the state of the output signal of the subtraction unit of the replica signal calculation unit.

Here, the states of the input and output signals of the functional units of the wireless transmission apparatus 10 will be described. FIGS. 9 to 24 are diagrams illustrating an example of the input and output signals of the functional units of the wireless transmission apparatus according to the first embodiment. FIGS. 9 to 24 illustrate constellations. In particular, FIGS. 9 to 16 illustrate the states (part 1) of the input and output signals without distortion compensation or balance correction. FIGS. 17 to 24 illustrate the states (part 2) of the input and output signals with distortion compensation and balance correction. More specifically, FIG. 9 is a diagram (part 1) illustrating the state of the input signal of the distortion compensation unit. FIG. 10 is a diagram (part 1) illustrating the state of the output signal of the distortion compensation unit. FIG. 11 is a diagram (part 1) illustrating the state of the output signals of the signal component separation unit. FIG. 12 is a diagram (part 1) illustrating the state of the input signals to the nonlinear amplifiers. FIG. 13 is a diagram (part 1) illustrating the state of the output signals of the nonlinear amplifiers. FIG. 14 is a diagram (part 1) illustrating the state of the output signal of the combination unit. FIG. 15 is a diagram (part 1) illustrating the state of the output signal of the multiplication unit of the replica signal calculation unit. FIG. 16 is a diagram (part 1) illustrating the state of the output signal of the subtraction unit of the replica signal calculation unit. FIG. 17 is a diagram (part 2) illustrating the state of the input signal of the distortion compensation unit. FIG. 18 is a diagram (part 2) illustrating the state of the output signal of the distortion compensation unit. FIG. 19 is a diagram (part 2) illustrating the state of the output signals of the signal component separation unit. FIG. 20 is a diagram (part 2) illustrating the state of the input signals to the nonlinear amplifiers. FIG. 21 is a diagram (part 2) illustrating the state of the output signals of the nonlinear amplifiers. FIG. 22 is a diagram (part 2) illustrating the state of the output signal of the combination unit. FIG. 23 is a diagram (part 2) illustrating the state of the output signal of the multiplication unit of the replica signal calculation unit. FIG. 24 is a diagram (part 2) illustrating the state of the output signal of the subtraction unit of the replica signal calculation unit.

Without Distortion Compensation or Balance Correction

FIG. 9 illustrates an example of a baseband signal x that is the input signal (two-tone signal) of the distortion compensation unit 22. A line L1 illustrated in FIG. 9 indicates that the baseband signal x has a phase of 0 [rad] or $\pi/2$ [rad] and an amplitude of between 0 and 1.

FIG. 10 illustrates an example of a predistortion signal u that is the output signal of the distortion compensation unit 22. Since the distortion compensation by the distortion compensation unit 22 is assumed to not be performed, the state of the predistortion signal u illustrated in FIG. 10 is the same as that of the baseband signal x illustrated in FIG. 9.

FIG. 11 illustrates the output signals of the signal component separation unit 31, namely, a first branch signal ua and a second branch signal ub. A line L21 illustrated by solid lines in FIG. 11 indicates the range of phases and amplitudes that the first branch signal ua can take. A line L22 illustrated by dotted lines indicates the range of phases and amplitudes that the second branch signal ub can take.

FIG. 12 illustrates the state of an input signal ua' to the nonlinear amplifier 32 and an input signal ub to the nonlinear amplifier 33. Since the balance correction by the adjustment unit 25 is assumed to not be performed, the state of the input signals ua' and ub illustrated in FIG. 12 is the same as that of the first blanch signal ua and the second branch signal ub illustrated in FIG. 11. A line L31 illustrated by solid lines in FIG. 12 indicates the range of phases and amplitudes that the input signal ua' to the nonlinear amplifier 32 can take. A line L32 illustrated by dotted lines indicates the range of phases and amplitudes that the input signal ub to the nonlinear amplifier 33 can take.

FIG. 13 illustrates the state of an output signal ua" of the nonlinear amplifier 32 and an output signal ub" of the nonlinear amplifier 33. A line L41 illustrated by solid lines in FIG. 13 indicates the range of phases and amplitudes that the output signal ua" of the nonlinear amplifier 32 can take. A line L42 illustrated by dotted lines indicates the range of phases and amplitudes that the output signal ub" of the nonlinear amplifier 33 can take. Here, the nonlinear amplifier 32 is assumed to have an amplifier characteristic of 1.01 in gain and 0.05 [rad] in phase rotation. The nonlinear amplifier 33 is assumed to have an amplifier characteristic of 0.95 in gain and −0.05 [rad] in phase rotation. Consequently, the line L41 is greater in amplitude and rotated counterclockwise in phase as compared to the line L31. The line L42 is smaller in amplitude and rotated clockwise in phase as compared to the line L32.

FIG. 14 illustrates the state of an output signal y of the combination unit 34. As can be seen from FIG. 14, the output signal y is distorted. One of the causes of the distortion is an imbalance between the branches. The foregoing distortion compensation device 11 performs processing for reducing such distortion.

FIG. 15 illustrates the state of an output signal yu of the multiplication unit 63 of the replica signal calculation unit 23. In other words, FIG. 15 illustrates the state of a replica signal yu of the predistortion signal u. Since the distortion compensation by the LUT 62 and the multiplication unit 63 is assumed to not be performed, the state of the replica signal yu of the predistortion signal u is the same as that of the output signal y of the combination unit 34.

FIG. 16 illustrates the state of an output signal ya of the subtraction unit 64 of the replica signal calculation unit 23. In other words, FIG. 16 illustrates the state of the replica signal ya of the first branch signal ua.

With Distortion Compensation and Balance Correction

FIG. 17 illustrates an example of the baseband signal x which is the input signal of the distortion compensation unit 22. The baseband signal x illustrated in FIG. 17 is the same as that illustrated in FIG. 9.

FIG. 18 illustrates an example of the predistortion signal u which is the output signal of the distortion compensation unit 22. The predistortion signal u illustrated in FIG. 18 is the baseband signal x multiplied by the foregoing first inverse distortion characteristic. The multiplication of the first inverse distortion characteristic is equivalent to compensating for the amplitude and phase of the second branch serving as the reference of the balance between the branches.

FIG. 19 illustrates the output signals of the signal component separation unit 31, i.e., the first branch signal ua and the second branch signal ub. A line L51 illustrated by solid lines in FIG. 19 indicates the range of phases and amplitudes that the first branch signal ua can take. A line L52 illustrated by dotted lines indicates the range of phases and amplitudes that the second branch signal ub can take. Because of the distortion compensation performed by the distortion compensation unit 22, the lines L51 and L52 are rotated counterclockwise in phase as compared to the lines L21 and L22 of FIG. 11.

FIG. 20 illustrates the state of the input signal ua' to the nonlinear amplifier 32 (i.e., the output signal ua' of the adjustment unit 25) and the input signal ub to the nonlinear amplifier 33. A line L61 illustrated by solid lines in FIG. 20 indicates the range of phases and amplitudes that the output signal ua' of the adjustment unit 25 can take. A line L62 illustrated by dotted lines indicates the range of phases and amplitudes that the input signal ub of the nonlinear amplifier 33 can take. As can be seen from a comparison between the line L61 of FIG. 20 and the line L51 of FIG. 19, the adjustment unit 25 makes an adjustment to reduce the amplitude of the first branch signal ua with a clockwise rotation in phase.

FIG. 21 illustrates the state of the output signal ua" of the nonlinear amplifier 32 and the output signal ub" of the nonlinear amplifier 33. A line L71 illustrated by solid lines in FIG. 21 indicates the range of phases and amplitudes that the output signal ua" of the nonlinear amplifier 32 can take. A line L72 illustrated by dotted lines indicates the range of phases and amplitudes that the output signal ub" of the nonlinear amplifier 33 can take. As can be seen from a comparison between FIGS. 21 and 13, the output signal ua" of the nonlinear amplifier 32 and the output signal ub" of the nonlinear amplifier 33 illustrated in FIG. 21 are in an ideal state such that the first branch signal ua and the second branch signal ub illustrated in FIG. 11 are amplified without distortion.

FIG. 22 illustrates the state of the output signal y of the combination unit 34. The output signal y of the combination unit 34 illustrated in FIG. 22 is free of distortion that is observed in the output signal y of the combination unit 34 illustrated in FIG. 14.

FIG. 23 illustrates the state of the output signal yu of the multiplication unit 63 of the replica signal calculation unit 23. In other words, FIG. 23 illustrates the state of the replica signal yu of the predistortion signal u. The replica signal yu illustrated in FIG. 23 is in the same ideal state as that of the predistortion signal u illustrated in FIG. 18 since distortion is eliminated from the output signal y of the combination unit 34.

FIG. 24 illustrates the state of the output signal ya of the subtraction unit 64 of the replica signal calculation unit 23. In other words, FIG. 24 illustrates the state of the replica signal ya of the first branch signal ua. The replica signal ya illustrated in FIG. 24 is in the same ideal state as that of the first branch signal ua illustrated in FIG. 19 since distortion is eliminated from the output signal y of the combination unit 34.

As descried above, according to the present the embodiment, the distortion compensation device 11 corrects the balance between the branches of the outphasing amplifier 12. In the distortion compensation device 11, the inverse characteristic calculation unit 21 calculates the "first inverse distortion characteristic" of the entire outphasing amplifier 12. The replica signal calculation unit 23 calculates the replica signal of the branch signal of the first branch of the outphasing amplifier 12 based on the calculated first inverse distortion characteristic, the branch signal of the second branch of the outphasing amplifier 12, and the output signal of the outphasing amplifier 12. The correction amount calculation unit 24 calculates the "second inverse distortion characteristic" of the nonlinear amplifier 32 arranged on the first branch, i.e., the balance correction amount between the branches based on the calculated replica signal of the first branch and the branch signal of the first branch.

With such a configuration of the distortion compensation device 11, the "first inverse distortion characteristic" of the entire outphasing amplifier 12 can be initially calculated, and the "second inverse distortion characteristic" of the nonlinear amplifier 32 arranged on the first branch can be calculated by using the "first inverse distortion characteristic." This can reduce the calculation load of the distortion compensation processing.

In the distortion compensation device 11, the inverse characteristic calculation unit 21, replica signal calculation unit 23, and correction amount calculation unit 24 perform the calculation processing by using the signals based on the baseband signal x of the same time.

[b] Second Embodiment

In the first embodiment, the inverse characteristic calculation unit 21 and the correction amount calculation unit 24 are described to calculate the inverse distortion characteristics by using the signals based on the baseband signal x in the same period T1. In contrast, in the second embodiment, the inverse characteristic calculation unit 21 and the correction amount calculation unit 24 calculate the inverse distortion characteristics by using signals based on the baseband signals in different periods. The wireless transmission apparatus according to the second embodiment has the same basic configuration as that of the wireless transmission apparatus 10 according to the first embodiment. The wireless transmission apparatus according to the second embodiment will thus be described with reference to FIGS. 1 to 6.

Figure 25:
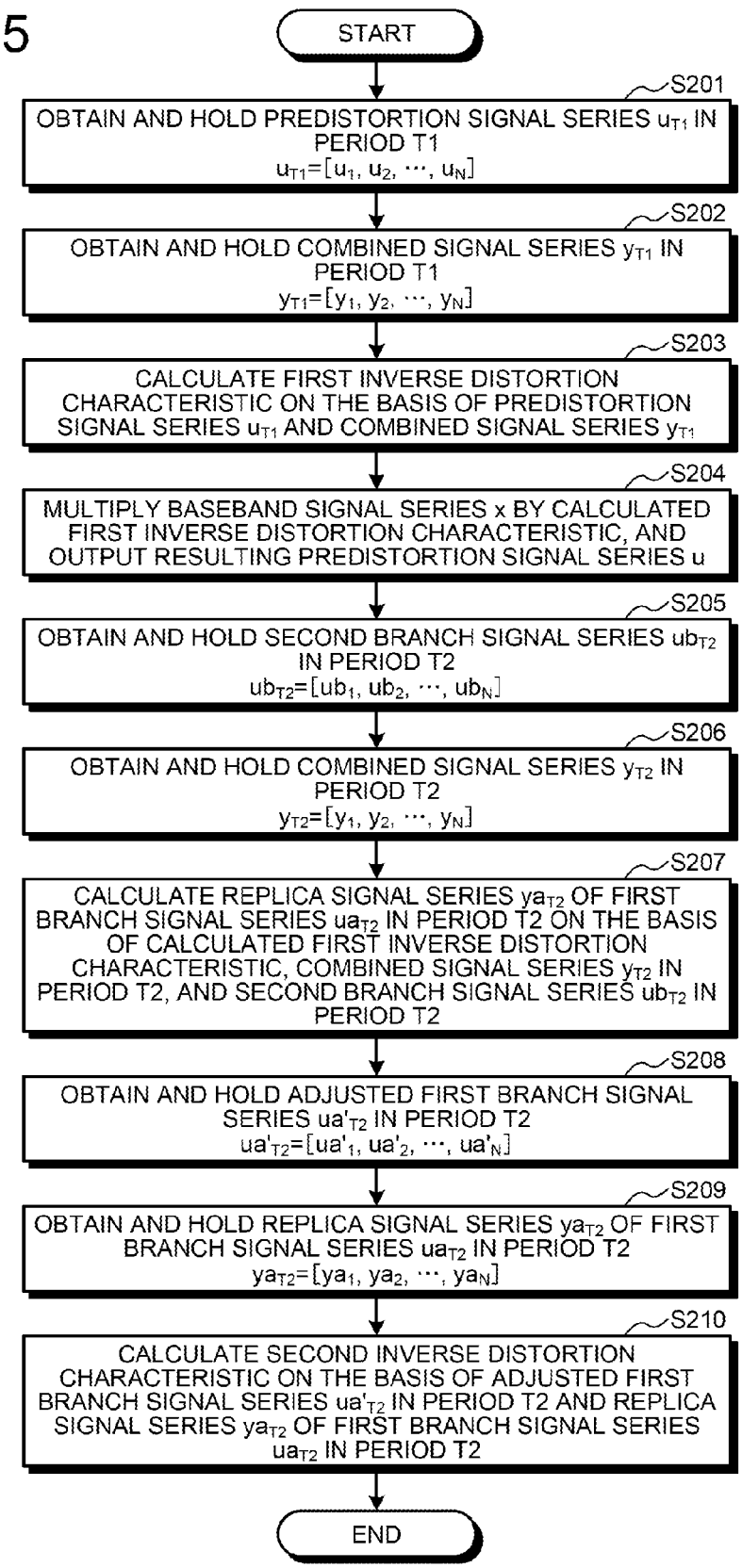
FIG. 25 is a flowchart illustrating an example of a processing operation of a wireless transmission apparatus according to a second embodiment.

FIG. 25 is a flowchart illustrating an example of a processing operation of the wireless transmission apparatus according to the second embodiment.

In the distortion compensation device 11 of the wireless transmission apparatus 10 according to the second embodiment, the inverse characteristic calculation unit 21 obtains and holds the predistortion signal series $u_{T1}$ (i.e., $u_i$: i=1 to N) in period T1 (step S201).

The inverse characteristic calculation unit 21 obtains and holds the combined signal series $y_{T1}$ (i.e., sample signal $y_i$: i=1 to N) which is the predistortion signal series $u_{T1}$ in period T1 amplified by the outphasing amplifier 12 and output from the outphasing amplifier 12 (step S202).

The inverse characteristic calculation unit 21 calculates the inverse characteristic of the distortion characteristic of the entire outphasing amplifier 12, i.e., the foregoing first inverse distortion characteristic based on the predistortion signal series $u_{T1}$ and the combined signal series $y_{T1}$ held in steps S201 and S202 (step S203).

The distortion compensation unit 22 multiplies the baseband signal series x by the first inverse distortion characteristic calculated in step S203, and outputs the resulting predistortion signal series u (step S204).

The replica signal calculation unit 23 obtains and holds a second branch signal series $ub_{T2}$ (i.e., samples $ub_1$: i=1 to N) in period T2 after period T1 (step S205).

The replica signal calculation unit 23 obtains and holds a combined signal series $y_{T2}$ (i.e., sample signal $y_i$: i=1 to N) in period T2 (step S206).

The replica signal calculation unit 23 calculates a replica signal $ya_{T2}$ (i.e., samples $ya_1$: i=1 to N) of the first branch signal series $ua_{T2}$ in period T2 based on the first inverse distortion characteristic calculated in step S203, the combined signal series $y_{T2}$ (i.e., sample signal $y_\pm$: i=1 to N) in period T2, and the second branch signal series $ub_{T2}$ (i.e., samples $ub_1$: i=1 to N) in period T2 (step S207).

The correction amount calculation unit 24 obtains and holds the adjusted first branch signal series $ua'_{T2}$ (i.e., samples $ua'_1$: i=1 to N) in period T2 (step S208).

The correction amount calculation unit 24 obtains and holds the replica signal series $ya_{T2}$ (i.e., replica signals $ya_1$: i=1 to N) of the first branch signal series $ua_{T2}$ (i.e., samples $ua_i$: i=1 to N) in period T2 (step S209).

The correction amount calculation unit 24 calculates the second inverse distortion characteristic based on the adjusted first branch signal series $ua'_{T2}$ in period T2 and the replica signal series $ya_{T2}$ of the first branch signal series $ua_{T2}$ in period T2 (step S210). The processing of steps S201 to S203 is then performed by using signals after period T2. The adjustment unit 25 then multiplies the first branch signal series ua after period T2 by the second inverse distortion characteristic calculated in step S210, and outputs the branch predistortion signal series ua' after period T2.

As described above, according to the present the embodiment, in the distortion compensation device 11, the inverse characteristic calculation unit 21 and the replica signal calculation unit 23 and correction amount calculation unit 24 perform the calculation processing by using the signals based on the baseband signals in different periods. More specifically, the inverse characteristic calculation unit 21 performs the calculation processing using the signals based on the baseband signal in period T1. The replica signal calculation unit 23 and the correction amount calculation unit 24 perform the calculation processing by using the signals based on the baseband signal in period T2 after period T1.

Such a configuration of the distortion compensation device 11 increases the possibility of reducing the time for the inverse characteristic to approach a target value.

[c] Third Embodiment

A third embodiment relates to a variation of the configuration of the inverse characteristic calculation unit 21, the distortion compensation unit 22, the replica signal calculation unit 23, the correction amount calculation unit 24, and the adjustment unit 25 of the distortion compensation device 11 described in the first and the second embodiments. More specifically, the first and the second embodiments have been described on the assumption that the inverse characteristic calculation unit 21, the distortion compensation unit 22, the replica signal calculation unit 23, the correction amount calculation unit 24, and the adjustment unit 25 each use a lookup table. In contrast, the third embodiment deals with a case where the inverse characteristic calculation unit 21, the distortion compensation unit 22, the replica signal calculation unit 23, the correction amount calculation unit 24, and the adjustment unit 25 use a "model series." The wireless transmission apparatus according to the third embodiment, including the distortion compensation device according to the first embodiment, has the same basic configuration as that of the wireless transmission apparatus 10 according to the first embodiment. The wireless transmission apparatus according to the third embodiment will thus be described with reference to FIG. 2.

The inverse characteristic calculation unit 21 of the third embodiment adjusts the coefficients ($a_1$, $a_3$, and $a_5$) to minimize the sum of the squares of the absolute values ($\Sigma|\epsilon|^2$) of the error signal $\epsilon_i$ in the following equation (10) by using the sample series (i.e., $u_i$ and $y_i$) at sample timing i (i=1 to N) in period T1. The inverse characteristic calculation unit 21 outputs the adjusted coefficients ($a_1$, $a_3$, and $a_5$) to the distortion compensation unit 22 and the replica signal calculation unit 23.

$$u_i = a_1 y_i + a_3 |y_i|^2 y_i + a_5 |y_i|^4 y_i + \epsilon_i \quad (10)$$

Figure 26:
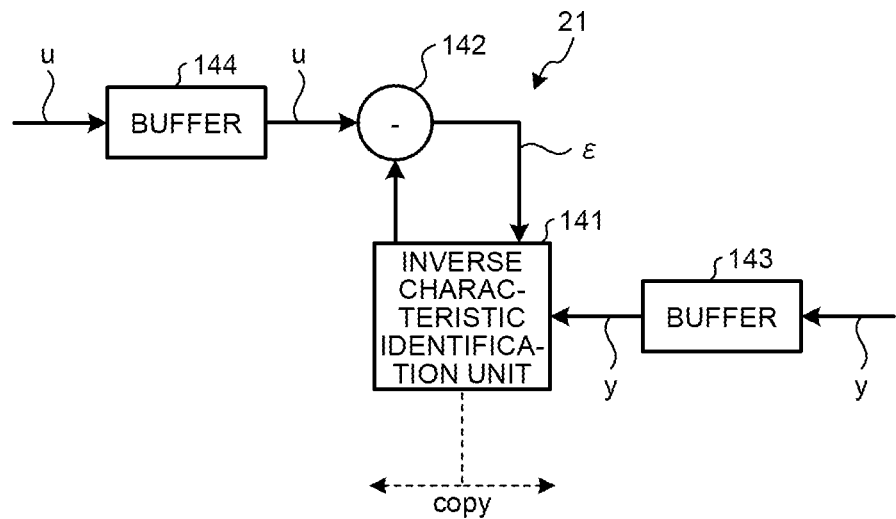
FIG. 26 is a block diagram illustrating an example of an inverse characteristic calculation unit according to a third embodiment.

FIG. 6 is a block diagram illustrating an example of the inverse characteristic calculation unit according to the third embodiment. In FIG. 26, the inverse characteristic calculation unit 21 includes an inverse characteristic identification unit 141, a subtraction unit 142, and buffers 143 and 144.

The buffer 143 holds the combined signal series $y_T$ ($y_T = [y_1, y_2, \ldots, y_N]$) in each period T. Here, $y_1, y_2, \ldots, y_N$ each are a sample in period T.

The buffer 144 holds the predistortion signal series $u_T$ ($u_T = [u_1, u_2, \ldots, u_N]$) in each period T. Here, $u_1, y_2, \ldots, u_N$ each are a sample in period T.

The inverse characteristic identification unit 141 substitutes the sample $y_k$ of the combined signal series $y_{T1}$ in period T1 held in the buffer 143 into the foregoing equation (10), and outputs the obtained result signal to the subtraction unit 142.

The subtraction unit 142 calculates an error signal $\epsilon_k$ between the result signal output from the inverse characteristic identification unit 141 and the sample $u_k$ of the predistortion signal series $u_{T1}$ in period T1 held in the buffer 144. The subtraction unit 142 returns the calculated error signal $\epsilon_k$ to the inverse characteristic identification unit 141.

The inverse characteristic identification unit 141 adjusts the coefficients ($a_1$, $a_3$, and $a_5$) of the foregoing equation (10) to reduce the error signal $\epsilon_k$ received from the subtraction unit 142.

The inverse characteristic identification unit 141 then substitutes the next sample $y_{k+1}$ of the combined signal series $y_{T1}$ in period T1 into the coefficient-adjusted equation (10), and outputs the obtained result signal to the subtraction unit 142.

The foregoing coefficient adjustment processing is repeated with respect to the sample timing i (i=1 to N) in period T1.

When the coefficient adjustment processing with respect to the sample timing i (i=1 to N) in period T1 ends, the inverse characteristic identification unit 141 outputs (i.e., copies) the adjusted coefficients ($a_1$, $a_3$, and $a_5$) to the distortion compensation unit 22 and the replica signal calculation unit 23.

The distortion compensation unit 22 according to the third embodiment multiplies the baseband signal series x by the first inverse distortion characteristic determined in period T1 to generate the predistortion signal series u. The distortion compensation unit 22 outputs the generated predistortion signal series u to the outphasing amplifier 12.

More specifically, the distortion compensation unit 22 substitutes the sample $x_k$ of the baseband signal series x into the following equation (11) to generate the sample $u_k$ of the predistortion signal series u.

$$u_i = a_1 y_i + a_3 |y_i|^2 y_i + a_5 |y_i|^4 y_i \quad (11)$$

Figure 27:
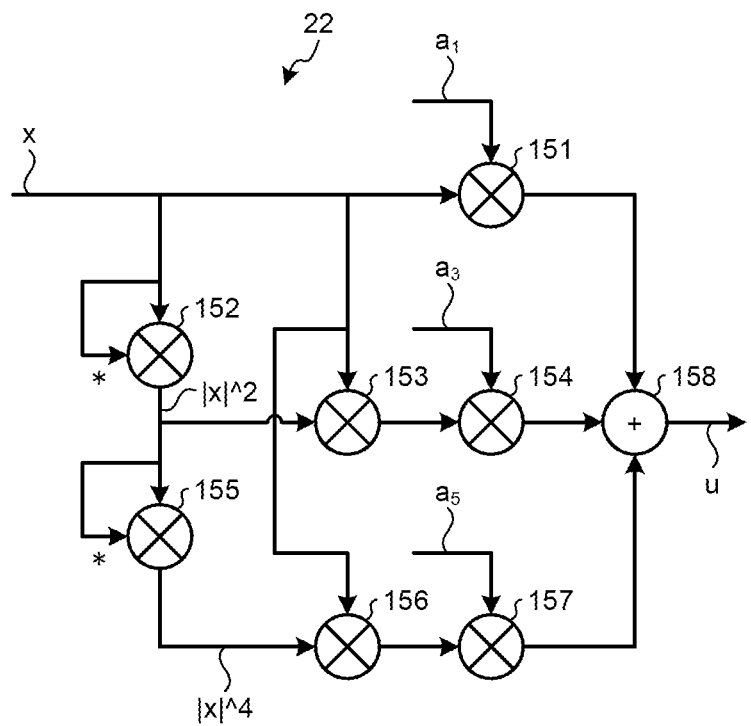
FIG. 27 is a block diagram illustrating an example of a distortion compensation unit according to the third embodiment.

FIG. 27 is a block diagram illustrating an example of the distortion compensation unit according to the third embodiment. In FIG. 27, the distortion compensation unit 22 includes multiplication units 151 to 157 and an addition unit 158.

The coefficient $a_1$ copied from the inverse characteristic identification unit 141 and the sample $x_k$ of the baseband signal series x are input to the multiplication unit 151. The multiplication unit 151 multiplies the coefficient $a_1$ and the sample $x_k$, and outputs the result of multiplication to the addition unit 158. In other words, the multiplication unit 151 corresponds to the first term in equation (11).

The multiplication unit 152 multiplies the sample $x_k$ of the baseband signal series x by the complex conjugate of the sample $x_k$ to determine a power value. The multiplication unit 152 then outputs the determined power value to the multiplication unit 153. The multiplication unit 153 multiplies the result of multiplication (i.e., power value) received from the multiplication unit 152 and the sample $x_k$ of the baseband signal series x, and outputs the result of multiplication to the multiplication unit 154. The multiplication unit 154 multiplies the result of multiplication received from the multiplication unit 153 and the coefficient $a_3$ received from the inverse characteristic identification unit 141, and outputs the result of multiplication to the addition unit 158. In other words, the multiplication units 152 to 154 correspond to the second term in equation (11).

Similarly, the multiplication units 152 and 155 to 157 correspond to the third term in equation (11).

The first term, the second term, and the third term of equation (11) are calculated as described above, and added by the addition unit 158. In consequence, the distortion compensation unit 22 performs the calculation processing expressed by equation (11).

The replica signal calculation unit 23 according to the third embodiment calculates the replica signal series ya of the first branch signal series ua based on the first inverse distortion characteristic, the second branch signal series ub, and the output signal of the outphasing amplifier 12 (i.e., the combined signal series y which is the output signal of the combination unit 34).

Figure 28:
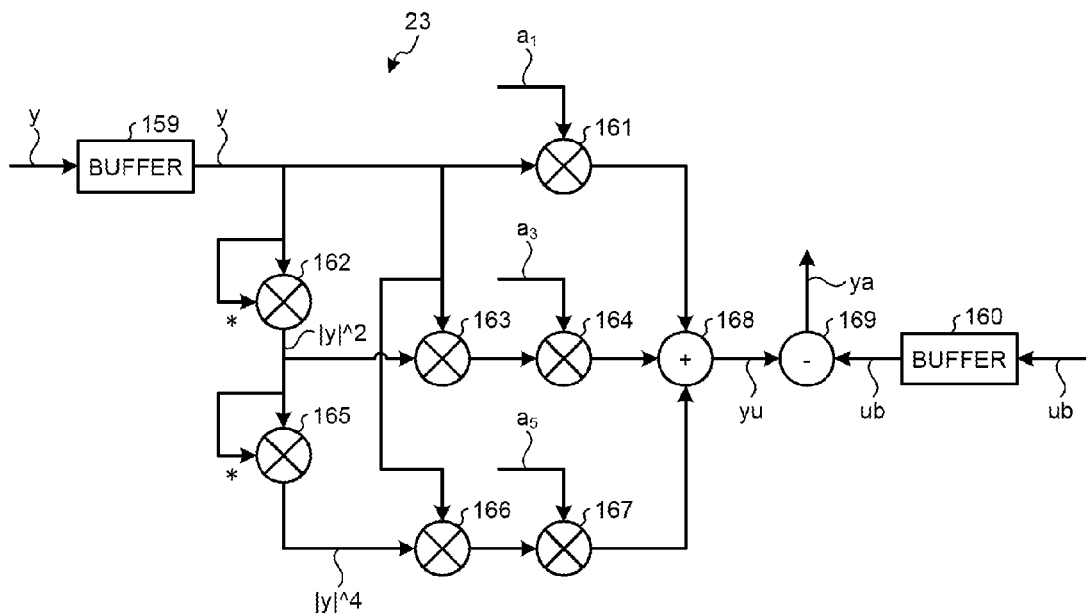
FIG. 28 is a block diagram illustrating an example of a replica signal calculation unit according to the third embodiment.

FIG. 28 is a block diagram illustrating an example of the replica signal calculation unit according to the third embodiment. In FIG. 28, the replica signal calculation unit 23 includes multiplication units 161 to 167, an addition unit 168, a subtraction unit 169, and buffers 159 and 160.

The buffer 159 holds the combined signal series $y_T$ ($y_T = [y_1, y_2, \ldots, y_N]$) in each period T. Here, $y_1, y_2, \ldots, y_N$ each are a sample in period T.

The buffer 160 holds the second branch signal series $ub_T$ ($ub_T = [ub_1, ub_2, \ldots, ub_N]$) in each period T. Here, $ub_1, ub_2, \ldots, ub_N$ each are a sample in period T.

The multiplication units 161 to 167 and the addition unit 168 perform the same processing as that of the multiplication units 151 to 157 and the addition unit 158 described above, except that the input signal is the sample $y_k$ of the combined signal series y and the output signal is the replica signal $yu_k$ of the sample $u_k$ of the predistortion signal series u.

The subtraction unit 169 calculates a difference between the replica signal $yu_k$ obtained by the addition unit 168 and the sample $ub_k$ of the second branch signal series ub held in the buffer 160 to calculate the replica signal $ya_k$ of the sample $ua_k$ of the first branch signal series ua.

The correction amount calculation unit 24 according to the third embodiment adjusts the coefficients ($a_1$, $a_3$, and $a_5$) to minimize the sum of the squares of the absolute values ($\Sigma |\epsilon|^2$) of the error signal $\epsilon_i$ in the following equation (12) by using the sample series (i.e., $ua'_i$ and $ya_i$) in period T1 including sample timing i (i=1 to N). The correction amount calculation unit 24 outputs the adjusted coefficients ($a_1$, $a_3$, and $a_5$) to the adjustment unit 25.

$$ua'_i = a_1 ya_i + a_3 |ya_i|^2 ya_i + a_5 |ya_i|^4 ya_i + \epsilon_i \quad (12)$$

Figure 29:
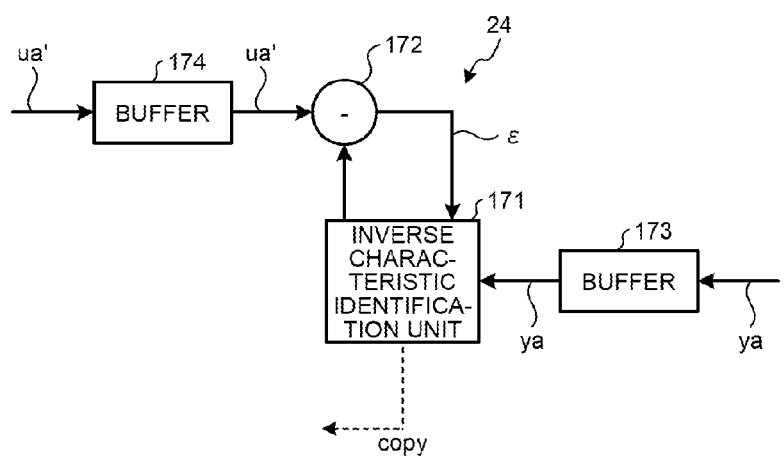
FIG. 29 is a block diagram illustrating an example of a correction amount calculation unit according to the third embodiment.

FIG. 29 is a block diagram illustrating an example of the correction amount calculation unit according to the third embodiment. In FIG. 29, the correction amount calculation unit 24 includes an inverse characteristic identification unit 171, a subtraction unit 172, and buffers 173 and 174.

The buffer 173 holds the replica signal series $ya_T$ ($ya_T=[ya_1, ya_2, \ldots, ya_N]$) of the first branch signal series ua in each period T. Here, $ya_1, ya_2, \ldots, ya_N$ each are a sample in period T.

The buffer 174 holds the adjusted first branch signal series $ua'_T$ ($ua'_T=[ua'_1, ua'_2, \ldots, ua'_N]$) in each period T. Here, $ua'_1, ua'_2, \ldots, ua'_N$ each are a sample in period T.

The inverse characteristic identification unit 171 substitutes the replica signal $ya_k$ of the sample $ua_k$ of the first branch signal series $ua_{T1}$ in period T1 held in the buffer 173 into the foregoing equation (12), and outputs the obtained result signal to the subtraction unit 172.

The subtraction unit 172 calculates an error signal $\epsilon_k$ between the result signal output from the inverse characteristic identification unit 171 and the sample $ua'_k$ of the adjusted first branch signal series $ua'_{T1}$ in period T1 held in the buffer 174. The subtraction unit 172 returns the calculated error signal $\epsilon_k$ to the inverse characteristic identification unit 171.

The inverse characteristic identification unit 171 adjusts the coefficients ($a_1, a_3,$ and $a_5$) of the foregoing equation (12) to reduce the error signal $\epsilon_k$ received from the subtraction unit 172.

The inverse characteristic identification unit 171 then substitutes the replica signal $ya_{k+1}$ of the next sample $ua_{k+1}$ of the first branch signal series $ua_{T1}$ in period T1 into the coefficient-adjusted equation (12), and outputs the obtained result signal to the subtraction unit 172.

The foregoing coefficient adjustment processing is repeated with respect to the sample timing i (i=1 to N) in period T1.

When the coefficient adjustment processing with respect to the sample timing i (i=1 to N) in period T1 ends, the inverse characteristic identification unit 171 outputs (i.e., copies) the adjusted coefficients ($a_1, a_3,$ and $a_5$) to the adjustment unit 25.

The adjustment unit 25 according to the third embodiment multiplies the first branch signal series $ua_{T2}$ in period T2 after period T1 by the second inverse distortion characteristic determined in period T1 to generate the branch predistortion signal series $ua'_{T2}$. The adjustment unit 25 outputs the generated branch predistortion signal series $ua'_{T2}$ to the correction amount calculation unit 24 and the nonlinear amplifier 32.

Figure 30:
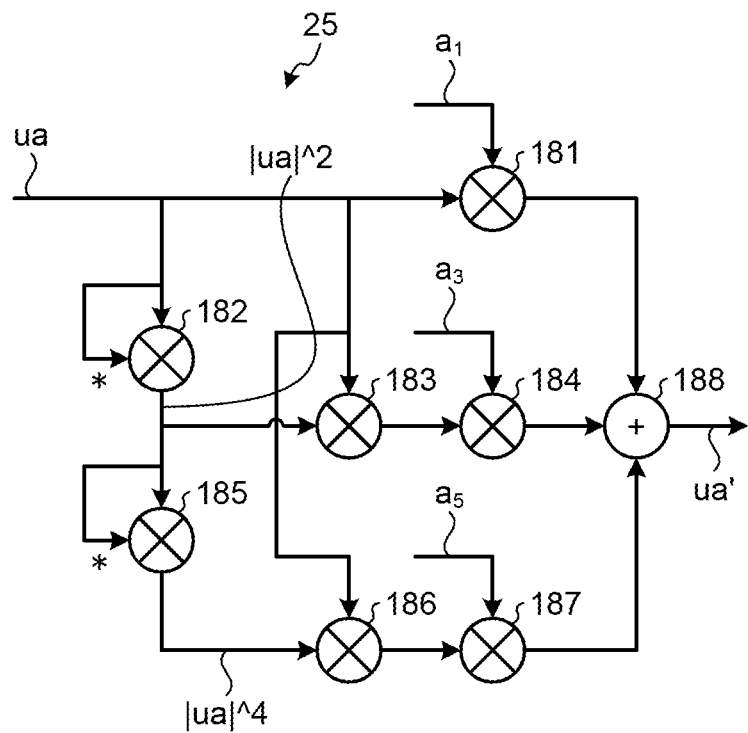
FIG. 30 is a block diagram illustrating an example of an adjustment unit according to the third embodiment.

FIG. 30 is a block diagram illustrating an example of the adjustment unit according to the third embodiment. In FIG. 30, the adjustment unit 25 includes multiplication units 181 to 187 and an addition unit 188. The multiplication units 181 to 187 and the addition unit 188 perform the same processing as that of the multiplication units 151 to 157 and the addition unit 158 described above, except that the input signal is the sample $ua_k$ of the first branch signal series $ua_{T2}$ in period T2 and the output signal is the sample $ua'_k$ of the branch predistortion signal series $ua'_{T2}$ in period T2.

Such a configuration provides the same effects as those of the first and the second embodiments.

[d] Other Embodiments

[1] The embodiments 1 to 3 have been described on the assumption that the combination unit 34 is a Chireix combiner. However, this is not restrictive. For example, the combination unit 34 may be a Wilkinson combiner. If the combination unit 34 is a Wilkinson combiner, for example, the equation used in the inverse characteristic calculation unit 21 may be a linear equation.

[2] The components of the units illustrated in the embodiments 1 to 3 do not necessarily need to be physically configured as illustrated in the drawings. In other words, the specific modes of distribution and integration of the units are not limited to the illustrated ones. All or part of the units may be functionally or physically distributed or integrated in arbitrary units according to various types of loads, use conditions, etc.

All or an arbitrary part of various processing functions performed by the apparatuses may be performed on a CPU (Central Processing Unit) (or a microcomputer such as an MPU (Micro Processing Unit) and an MCU (Micro Controller Unit)). All or an arbitrary part of the various processing functions may be performed on a program that is analyzed and executed by a CPU (or a microcomputer such as MPU and MCU) or on wired logic hardware.

The wireless transmission apparatuses according to the embodiments 1 to 3 can be implemented, for example, by the following hardware configuration.

Figure 31:
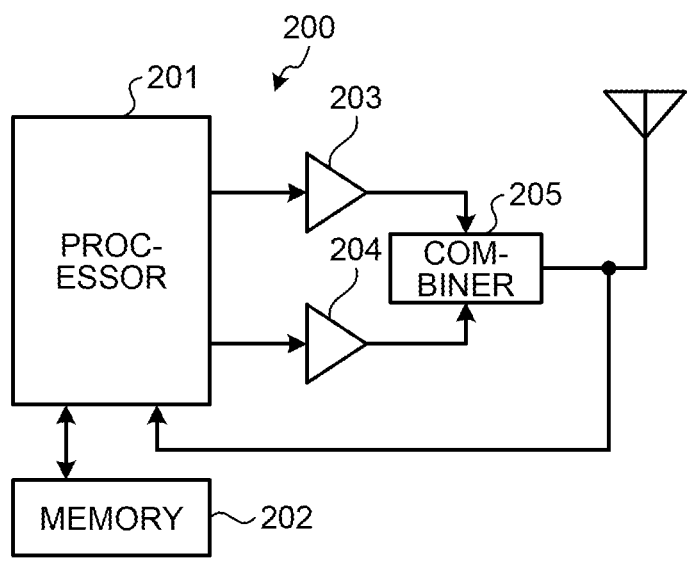
FIG. 31 is a diagram illustrating a hardware configuration example of a wireless transmission apparatus.

FIG. 31 is a diagram illustrating a hardware configuration example of a wireless transmission apparatus. As illustrated in FIG. 31, a wireless transmission apparatus 200 includes a processor 201, a memory 202, amplifiers 203 and 204, and a combiner 205. Examples of the processor 201 include a CPU, a DSP (Digital Signal Processor), and an FPGA (Field Programmable Gate Array). Examples of the memory 202 include a RAM (Random Access Memory) such as an SDRAM (Synchronous Dynamic Random Access Memory), a ROM (Read Only Memory), and a flash memory.

The various processing functions performed by the wireless transmission apparatuses according to the embodiments 1 to 3 may be implemented by the processor executing programs stored in various memories such as a nonvolatile storage medium. More specifically, programs corresponding to the processing performed by the distortion compensation device 11 and the signal component separation unit 31 may be recorded in the memory 202, and the programs may be performed by the processor 201. The nonlinear amplifiers 32 and 33 are implemented by the amplifiers 203 and 204. The combination unit 34 is implemented by the combiner 205.

The various processing functions performed by the wireless transmission apparatuses according to the embodiments 1 to 3 are described here to be performed by a single processor 201. However, this is not restrictive, and the various processing functions may be performed by a plurality of processors.

According to the disclosed mode, the calculation load of the distortion compensation processing can be reduced.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A distortion compensation device for correcting balance between a first branch and a second branch of an outphasing amplifier, the outphasing amplifier including a first nonlinear amplifier that is arranged on the first branch, a second nonlinear amplifier that is arranged on the second branch, a signal component separation unit that separates an input signal into a first branch signal and a second branch signal having a constant amplitude, the first branch signal and the second branch signal having a phase difference according to an amplitude of the input signal, and outputs the first branch signal and the second branch signal to the first branch and the second branch, respectively, and a combiner that combines a first amplification signal output from the first nonlinear amplifier and a second amplification signal output from the second nonlinear amplifier and outputs the combined signal, the distortion compensation device comprising:

- an adjustment unit that is arranged in an input stage of the first nonlinear amplifier on the first branch and outputs a signal obtained by adjusting a phase and an amplitude of the first branch signal by using a balance correction amount to the first nonlinear amplifier;
- a first calculation unit that calculates a first inverse distortion characteristic of the entire outphasing amplifier based on the input signal and the combined signal;
- a second calculation unit that calculates a replica signal of the first branch signal based on the calculated first inverse distortion characteristic, the second branch signal, and the combined signal; and
- a third calculation unit that calculates the balance correction amount based on the calculated replica signal of the first branch signal and the signal output from the adjustment unit.

2. The distortion compensation device according to claim 1, wherein the second calculation unit includes:
- a fourth calculation unit that multiplies the combined signal by the first inverse distortion characteristic to calculate a replica signal of the input signal; and
- a subtraction unit that calculates a difference between the calculated replica signal of the input signal and the second branch signal to calculate the replica signal of the first branch signal.

3. A distortion compensation method for correcting balance between a first branch and a second branch of an outphasing amplifier, the outphasing amplifier including a first nonlinear amplifier that is arranged on the first branch, a second nonlinear amplifier that is arranged on the second branch, a signal component separation unit that separates an input signal into a first branch signal and a second branch signal having a constant amplitude, the first branch signal and the second branch signal having a phase difference according to an amplitude of the input signal, and outputs the first branch signal and the second branch signal to the first branch and the second branch, respectively, and a combiner that combines a first amplification signal output from the first nonlinear amplifier and a second amplification signal output from the second nonlinear amplifier and outputs the combined signal, the distortion compensation method comprising:

- adjusting a phase and an amplitude of the first branch signal by using a balance correction amount in an input stage of the first nonlinear amplifier on the first branch, and outputting the adjusted signal to the first nonlinear amplifier;
- calculating a first inverse distortion characteristic of the entire outphasing amplifier based on the input signal and the combined signal;
- calculating a replica signal of the first branch signal based on the calculated first inverse distortion characteristic, the second branch signal, and the combined signal; and
- calculating the balance correction amount based on the calculated replica signal of the first branch signal and the adjusted signal.

* * * * *